(12) United States Patent
Chikuma

(10) Patent No.: US 11,570,896 B2
(45) Date of Patent: Jan. 31, 2023

(54) SUPPORTING-TERMINAL-EQUIPPED CAPACITOR CHIP AND MOUNTED STRUCTURE THEREOF

(71) Applicant: Murata Manufacturing Co., Ltd., Nagaokakyo (JP)

(72) Inventor: Shinobu Chikuma, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/075,749

(22) Filed: Oct. 21, 2020

(65) Prior Publication Data

US 2021/0127493 A1 Apr. 29, 2021

(30) Foreign Application Priority Data

Oct. 28, 2019 (JP) .............................. JP2019-195048

(51) Int. Cl.
| | |
|---|---|
| H05K 1/18 | (2006.01) |
| H01G 4/30 | (2006.01) |
| H01G 4/248 | (2006.01) |
| H05K 1/11 | (2006.01) |

(52) U.S. Cl.
CPC ............ *H05K 1/181* (2013.01); *H01G 4/248* (2013.01); *H01G 4/30* (2013.01); *H05K 1/111* (2013.01); *H05K 2201/10015* (2013.01); *H05K 2201/10636* (2013.01); *H05K 2201/10954* (2013.01)

(58) Field of Classification Search
CPC ..................................................... H05K 1/181
USPC ........................................................ 174/260
See application file for complete search history.

(56) References Cited

U.S. PATENT DOCUMENTS

| | | | | |
|---|---|---|---|---|
| 2016/0307700 | A1* | 10/2016 | Park ........................ | H05K 3/301 |
| 2017/0372840 | A1* | 12/2017 | Takahashi ......... | C04B 35/62685 |
| 2018/0174753 | A1* | 6/2018 | Terashita ............... | H01G 4/232 |

FOREIGN PATENT DOCUMENTS

| | | | |
|---|---|---|---|
| JP | 2012-033652 A | | 2/2012 |
| JP | 2012 033654 | * | 2/2012 |

* cited by examiner

*Primary Examiner* — Stanley Tso
(74) *Attorney, Agent, or Firm* — Keating & Bennett, LLP

(57) ABSTRACT

A mounted structure of a supporting-terminal-equipped capacitor chip includes first and second supporting terminals. The first supporting terminal includes a first helical electrically conductive portion extending in a first axial direction along a main surface. The second supporting terminal includes a second helical electrically conductive portion extending in a second axial direction along the main surface. The first helical electrically conductive portion is electrically connected to a first outer electrode at an outer peripheral side surface of the first helical electrically conductive portion. The second helical electrically conductive portion is electrically connected to a second outer electrode at an outer peripheral side surface of the second helical electrically conductive portion.

17 Claims, 14 Drawing Sheets

SUPPORTING-TERMINAL-EQUIPPED CAPACITOR CHIP AND MOUNTED STRUCTURE THEREOF

CROSS REFERENCE TO RELATED APPLICATIONS

This application claims the benefit of priority to Japanese Patent Application No. 2019-195048 filed on Oct. 28, 2019. The entire contents of this application are hereby incorporated herein by reference.

BACKGROUND OF THE INVENTION

1. Field of the Invention

The present invention relates to a supporting-terminal-equipped capacitor chip and a mounted structure thereof.

2. Description of the Related Art

As a prior art document, Japanese Patent Laid-Open No. 2012-33652 discloses a ceramic capacitor to reduce acoustic noise generated in a circuit board. A multilayer ceramic capacitor described in Japanese Patent Laid-Open No. 2012-33652 includes a ceramic capacitor element and a connection terminal. The ceramic capacitor element has an outer electrode. The connection terminal connects the outer electrode to the circuit board. The connection terminal has a coil spring that has one end connected to the outer electrode side and the other end connected to the circuit board side.

Since the coil spring of the connection terminal in the ceramic capacitor described in Japanese Patent Laid-Open No. 2012-33652 is connected to the outer electrode at the end portion of the coil spring in the axial direction, the height dimension or length size of the ceramic capacitor including the coil spring becomes large. This results in a large occupied space.

SUMMARY OF THE INVENTION

Preferred embodiments of the present invention provide supporting-terminal-equipped capacitor chips and mounted structures thereof, each having an occupied space that is significantly reduced while significantly reducing acoustic noise.

A mounted structure of a supporting-terminal-equipped capacitor chip according to a preferred embodiment of the present invention includes a capacitor chip, a first supporting terminal, a second supporting terminal, and a circuit board. The first supporting terminal and the second supporting terminal support the capacitor chip. The circuit board includes a main surface on which each of a first land and a second land is provided, the first land being connected to the first supporting terminal, the second land being connected to the second supporting terminal. The capacitor chip includes a multilayer body, a first outer electrode, and a second outer electrode. The multilayer body includes a plurality of dielectric layers and a plurality of inner electrode layers alternately layered. The multilayer body includes a first main surface and a second main surface facing each other in a height direction, a first side surface and a second side surface facing each other in a width direction orthogonal or substantially orthogonal to the height direction, and a first end surface and a second end surface facing each other in a length direction orthogonal or substantially orthogonal to both the height direction and the width direction. Each of the first outer electrode and the second outer electrode is provided on a surface of the multilayer body. The plurality of inner electrode layers include a first inner electrode layer connected to the first outer electrode and a second inner electrode layer connected to the second outer electrode. The first supporting terminal includes a first helical electrically conductive portion extending in a first axial direction along the main surface of the circuit board. The second supporting terminal includes a second helical electrically conductive portion extending in a second axial direction along the main surface of the circuit board. The first helical electrically conductive portion is electrically connected to the first outer electrode at an outer peripheral side surface of the first helical electrically conductive portion. The second helical electrically conductive portion is electrically connected to the second outer electrode at an outer peripheral side surface of the second helical electrically conductive portion.

A supporting-terminal-equipped capacitor chip according to a preferred embodiment of the present invention includes a capacitor chip, and a first supporting terminal and a second supporting terminal that each support the capacitor chip. The capacitor chip includes a multilayer body, and a first outer electrode and a second outer electrode each provided on a surface of the multilayer body. The multilayer body includes a plurality of dielectric layers and a plurality of inner electrode layers alternately layered. The multilayer body includes a first main surface and a second main surface facing each other in a height direction, a first side surface and a second side surface facing each other in a width direction orthogonal or substantially orthogonal to the height direction; and a first end surface and a second end surface facing each other in a length direction orthogonal or substantially orthogonal to both the height direction and the width direction. The plurality of inner electrode layers include a first inner electrode layer connected to the first outer electrode and a second inner electrode layer connected to the second outer electrode. The first supporting terminal includes a first helical electrically conductive portion extending in a first axial direction along the second main surface. The second supporting terminal includes a second helical electrically conductive portion extending in a second axial direction along the second main surface. The first helical electrically conductive portion is electrically connected to the first outer electrode at an outer peripheral side surface of the first helical electrically conductive portion. The second helical electrically conductive portion is electrically connected to the second outer electrode at an outer peripheral side surface of the second helical electrically conductive portion.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
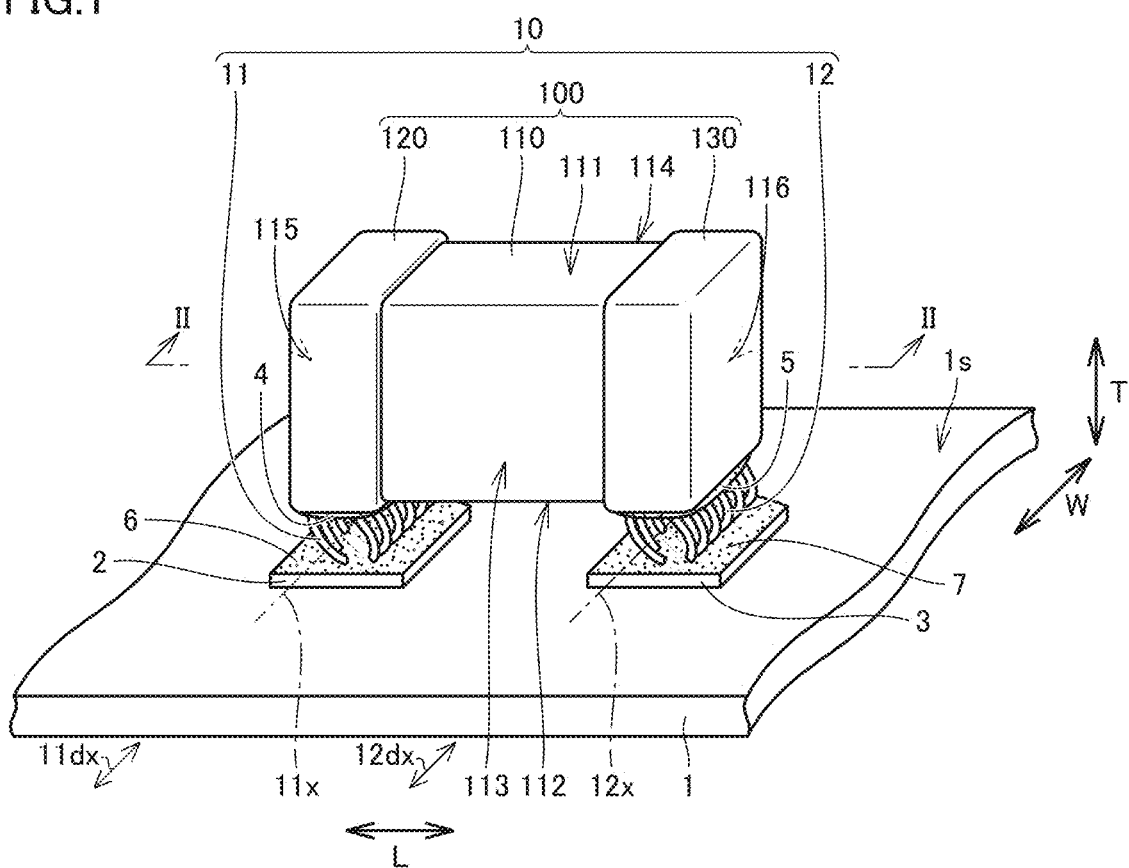
FIG. 1 is a perspective view showing a mounted structure of a supporting-terminal-equipped capacitor chip according to a first preferred embodiment of the present invention.

Hereinafter, supporting-terminal-equipped capacitor chips and mounted structures thereof according to preferred embodiments of the present invention will be described with reference to the figures. In the following description of the preferred embodiments, the same or corresponding portions in the figures are denoted by the same reference characters, and will not be described repeatedly.

Figure 2:
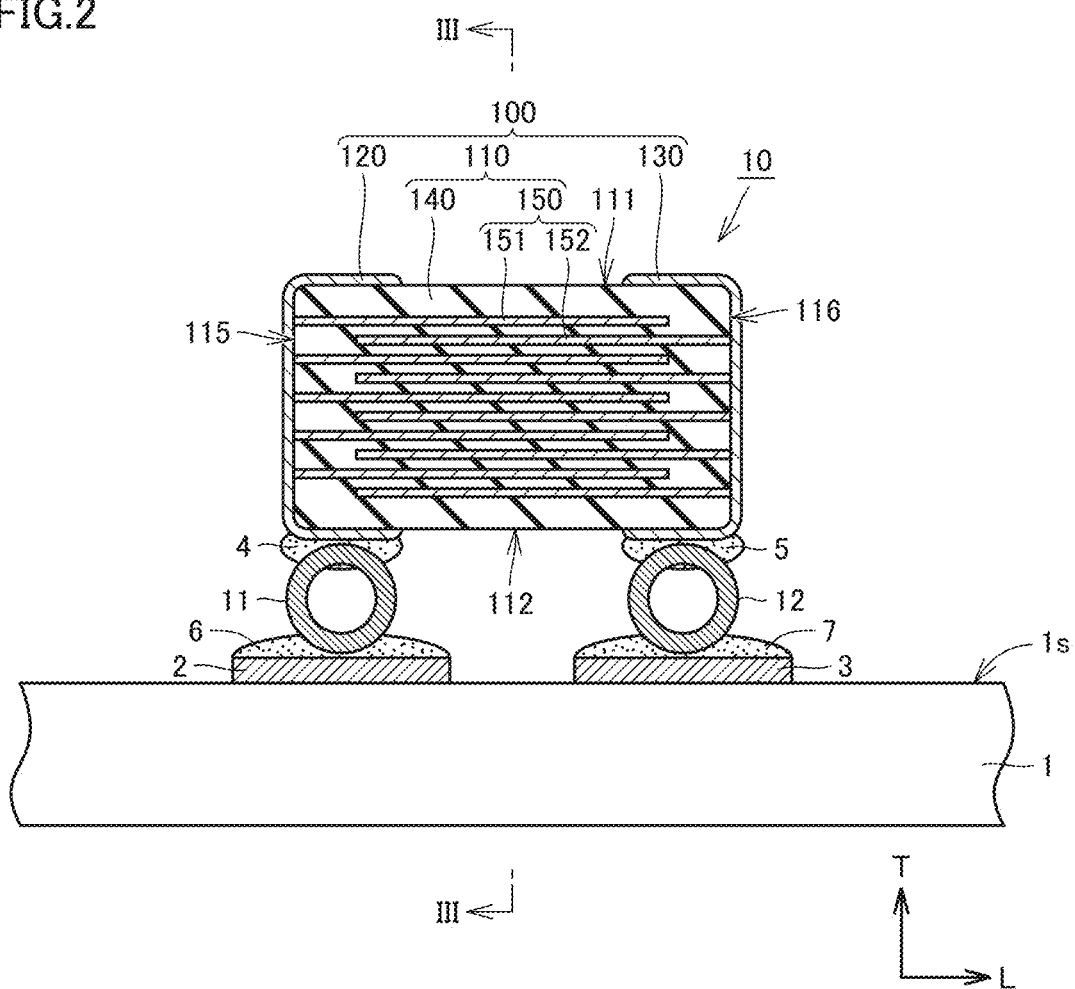
FIG. 2 is a cross sectional view showing the mounted structure of the supporting-terminal-equipped capacitor chip of FIG. 1 when viewed in a direction of a line arrow II-II.
Figure 3:
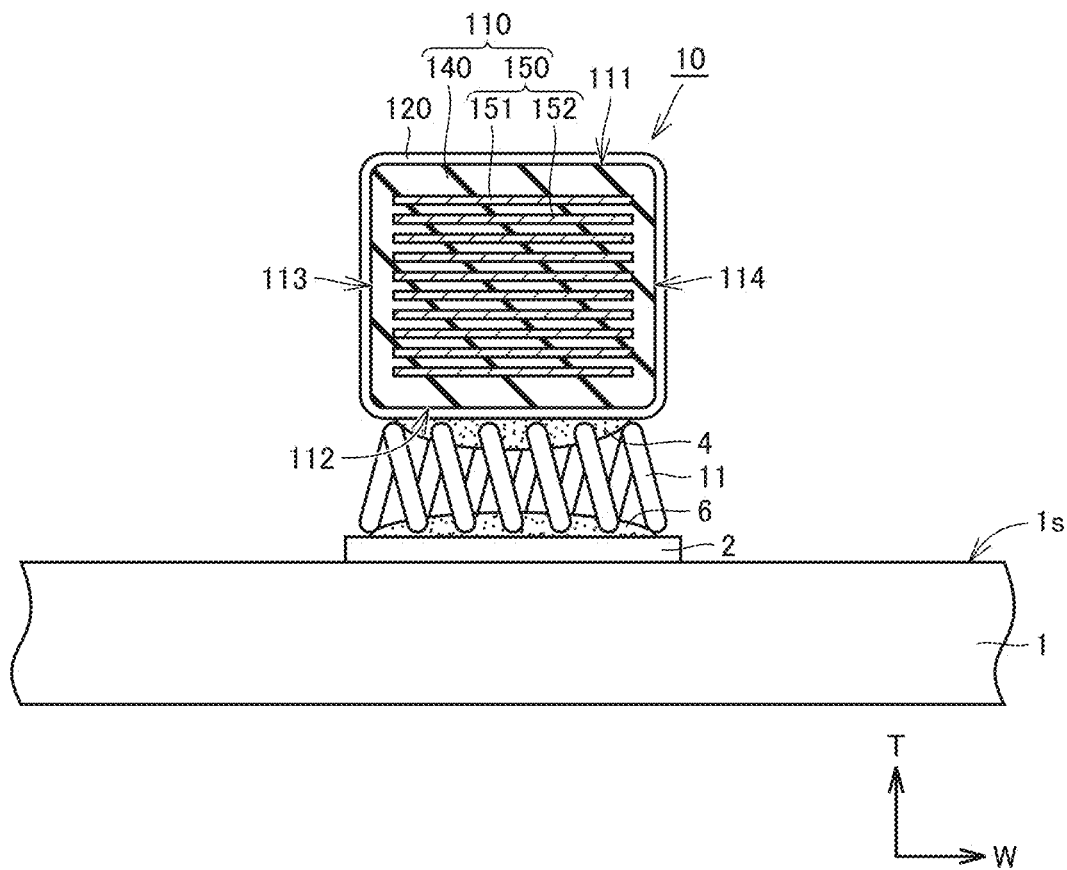
FIG. 3 is a cross sectional view showing the mounted structure of the supporting-terminal-equipped capacitor chip of FIG. 2 when viewed in a direction of a line arrow III-III.
Figure 4:
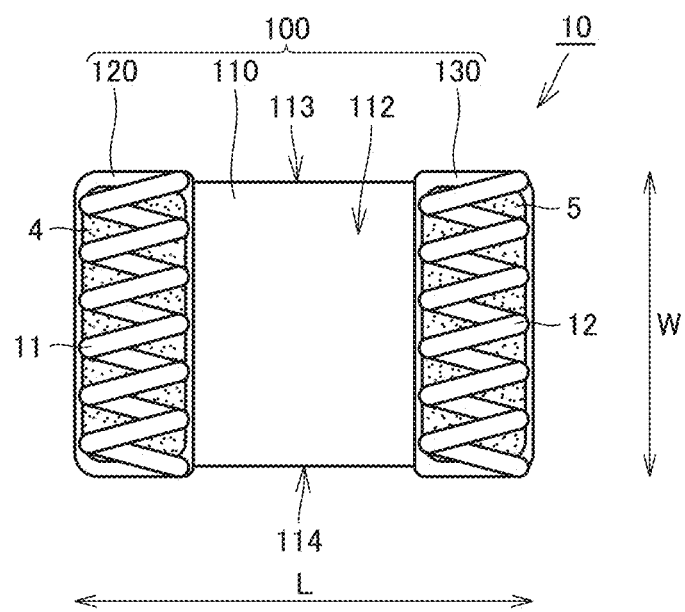
FIG. 4 is a diagram showing the supporting-terminal-equipped capacitor chip according to the first preferred embodiment of the present invention when viewed from the second main surface side.
Figure 5:
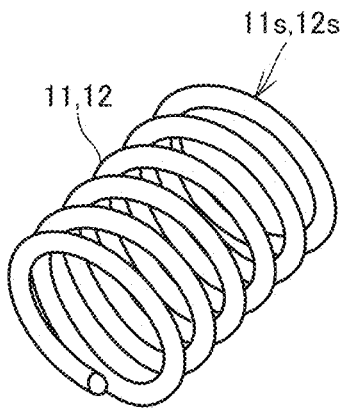
FIG. 5 is a perspective view showing an external appearance of each of the first supporting terminal and the second supporting terminal included in the supporting-terminal-equipped capacitor chip according to the first preferred embodiment of the present invention.

FIG. 1 is a perspective view showing a mounted structure of a supporting-terminal-equipped capacitor chip according to a first preferred embodiment of the present invention. FIG. 2 is a cross sectional view showing the mounted structure of the supporting-terminal-equipped capacitor chip of FIG. 1 when viewed in a direction of a line arrow II-II. FIG. 3 is a cross sectional view showing the mounted structure of the supporting-terminal-equipped capacitor chip of FIG. 2 when viewed in a direction of a line arrow III-III. FIG. 4 is a diagram showing the supporting-terminal-equipped capacitor chip according to the first preferred embodiment of the present invention when viewed from the second main surface side. FIG. 5 is a perspective view showing an external appearance of each of the first supporting terminal and the second supporting terminal included in the supporting-terminal-equipped capacitor chip according to the first preferred embodiment of the present invention.

As shown in FIGS. 1 to 3, a mounted structure of a supporting-terminal-equipped capacitor chip 10 according to the first preferred embodiment of the present invention includes a capacitor chip 100, a first supporting terminal, a second supporting terminal, and a circuit board 1.

Capacitor chip 100 includes a multilayer body 110, a first outer electrode 120, and a second outer electrode 130. Multilayer body 110 includes a plurality of dielectric layers 140 and a plurality of inner electrode layers 150, which are alternately layered along a height direction T.

Multilayer body 110 includes a first main surface 111 and a second main surface 112 facing each other in height direction T, a first side surface 113 and a second side surface 114 facing each other in a width direction W orthogonal or substantially orthogonal to height direction T, and a first end surface 115 and a second end surface 116 facing each other in a length direction L orthogonal or substantially orthogonal to both height direction T and width direction W. Second main surface 112 faces a main surface 1s of circuit board 1.

First outer electrode 120 is provided on the first end surface 115 side of a surface of multilayer body 110. First outer electrode 120 extends from first end surface 115 onto second main surface 112. In the first preferred embodiment, first outer electrode 120 is formed on the whole of first end surface 115 of multilayer body 110 and is formed to extend from first end surface 115 onto first main surface 111, second main surface 112, first side surface 113, and second side surface 114.

Second outer electrode 130 is provided on the second end surface 116 side of a surface of multilayer body 110. Second outer electrode 130 extends from second end surface 116 onto second main surface 112. In the first preferred embodiment, second outer electrode 130 is formed on the whole of second end surface 116 of multilayer body 110 and is formed to extend from second end surface 116 onto first main surface 111, second main surface 112, first side surface 113, and second side surface 114.

The plurality of inner electrode layers 150 includes a plurality of first inner electrode layers 151 connected to first outer electrode 120 and a plurality of second inner electrode layers 152 connected to second outer electrode 130. FIG. 2 illustrates an example in which five first inner electrode layers 151 and five second inner electrode layers 152 are provided; however, each of the number of first inner electrode layers 151 and the number of second inner electrode layers 152 is not limited to five. In the first preferred embodiment, the layering direction of the plurality of inner electrode layers 150 is along height direction T, but may be along width direction W.

In the first preferred embodiment, the size of multilayer body 110 in length direction L is preferably more than or equal to about 1.0 mm, the size of multilayer body 110 in width direction W is preferably more than or equal to about 0.5 mm, and the size of multilayer body 110 in height direction T is preferably more than or equal to about 0.5 mm, for example. The size of multilayer body 110 in length direction L and the size of multilayer body 110 in width direction W are sizes at the central portion of multilayer body 110 in height direction T, and the size of multilayer body 110 in height direction T is a size at the central portion of multilayer body 110 in length direction L. The sizes of multilayer body 110 are able to be measured using a micrometer or an optical microscope.

Multilayer body 110 preferably has rounded corner portions and ridgeline portions, for example. Each of the corner portions is a portion at which three surfaces of multilayer body 110 intersect one another. Each of the ridgeline portions is a portion at which two surfaces of multilayer body 110 intersect each other.

The thickness of a dielectric layer 140 between a first inner electrode layer 151 and a second inner electrode layer 152 is preferably more than or equal to about 0.5 µm and less than or equal to about 10 µm, for example. Each of the thickness of a dielectric layer 140 defining first main surface 111 and adjacent to an inner electrode layer closest to first main surface 111 among the plurality of inner electrode layers 150 and the thickness of a dielectric layer 140 defining second main surface 112 and adjacent to the inner electrode layer closest to second main surface 112 among the plurality of inner electrode layers 150 is preferably more than or equal to about 100 µm and less than or equal to about 200 µm, for example. The thickness of each dielectric layer 140 is a size at the central portion of multilayer body 110 in width direction W.

Each of the plurality of dielectric layers 140 includes, as a main component, dielectric particles each having a perovskite structure including at least Ti, for example, $BaTiO_3$, $CaTiO_3$, or $SrTiO_3$. In addition to the main component, an accessory component having a content smaller than that of the main component may be included therein. The accessory component is at least one of a Mn compound, a Mg compound, a Si compound, a Fe compound, a Cr compound, a Co compound, a Ni compound, an Al compound, a V compound, and a rare earth compound. The dielectric constant of the material of dielectric layer 140 is preferably more than or equal to about 1000, for example.

The thickness of each of first inner electrode layer 151 and second inner electrode layer 152 is preferably more than or equal to about 0.2 µm and less than or equal to about 2.0 µm, for example. As a material of each of first inner electrode layer 151 and second inner electrode layer 152, one metal selected from a group consisting of Ni, Cu, Ag, Pd, and Au, or an alloy including the metal may be included. For example, an alloy of Ag and Pd or the like may be included. Each of first inner electrode layer 151 and second inner electrode layer 152 may include dielectric particles having the same composition as or a similar composition to that of a dielectric ceramic included in dielectric layer 140.

The thickness of each of dielectric layer 140, first inner electrode layer 151, and second inner electrode layer 152 is able to be measured by the following method.

First, a surface of multilayer body 110 defined by height direction T and width direction W, that is, a surface of multilayer body 110 orthogonal or substantially orthogonal to length direction L is exposed by grinding. The exposed cross section is observed by a scanning electron microscope. Next, the thickness of dielectric layer 140 is measured on a total of the following five lines: a central line extending through the center of the exposed cross section along height direction T; two lines at equal or substantially equal intervals on one side with respect to the center line; and two lines at equal or substantially equal intervals on the other side with respect to the center line. The average value of the five measured values is regarded as the thickness of dielectric layer 140.

The thickness of each of first inner electrode layer 151 and second inner electrode layer 152 is also able to be measured using a scanning electron microscope in the same or a similar cross section as the cross section in which the thickness of dielectric layer 140 is measured, similar to the method for measuring the thickness of dielectric layer 140.

Each of first outer electrode 120 and second outer electrode 130 includes, for example, an underlying electrode layer and a plating layer provided on the underlying electrode layer. The underlying electrode layer includes at least one of a baked electrode layer, a resin electrode layer, a thin film electrode layer, and the like.

The baked electrode layer is a layer including glass and a metal. One baked electrode layer or a plurality of baked electrode layers may be provided. The baked electrode layer includes, for example, one metal selected from a group consisting of Ni, Cu, Ag, Pd and Au, or an alloy including the metal. For example, the baked electrode includes an alloy of Ag and Pd, or the like.

The baked electrode layer is formed by applying an electrically conductive paste including the glass and the metal onto multilayer body 110 and performing baking thereto. The baking may be performed simultaneously with calcination of multilayer body 110 or may be performed after the calcination of multilayer body 110.

The resin electrode layer is able to be formed as a layer including electrically conductive particles and a thermosetting resin, for example. In the case of forming the resin electrode layer, the resin electrode layer may be directly formed on the multilayer body without forming the baked electrode layer. One resin electrode layer or a plurality of resin electrode layers may be provided.

The thin film electrode layer is a layer of less than or equal to about 1 µm in which metal particles are deposited, for example. The thin film electrode layer is able to be formed by a known thin film forming method, for example, a sputtering method or a vapor deposition method.

The plating layer provided on the underlying electrode layer includes one metal selected from a group consisting of Ni, Cu, Ag, Pd and Au, or an alloy including the metal, for example. For example, the plating layer includes an alloy of Ag and Pd or the like. One plating layer or a plurality of plating layers may be provided. The plating layer preferably includes a two-layer structure in which a Sn plating layer is formed on a Ni plating layer, for example. The Ni plating layer significantly reduces or prevents erosion of the underlying electrode layer by a solder when mounting capacitor chip 100. The Sn plating layer significantly increases solder wettability when mounting capacitor chip 100.

Each of first outer electrode 120 and second outer electrode 130 may include no underlying electrode layer and may include a plating layer directly provided on multilayer body 110. Accordingly, the plating layer is directly connected to first inner electrode layer 151 or second inner electrode layer 152. The ratio of the metal of the plating layer per unit volume is preferably more than or equal to about 99 volume %, for example. Further, the plating layer preferably includes no glass, for example.

As shown in FIGS. 1 to 4, each of a first land 2 and a second land 3 is provided on main surface 1s of circuit board 1. First land 2 is connected to first supporting terminal and second land 3 is connected to the second supporting terminal.

The first supporting terminal and the second supporting terminal support capacitor chip 100. As shown in FIG. 1, the first supporting terminal includes a first helical electrically conductive portion 11 extending in a first axial direction 11dx of a winding axis 11x along main surface 1s. First axial direction 11dx of winding axis 11x is also along second main surface 112. In the first preferred embodiment, the first supporting terminal includes only first helical electrically conductive portion 11.

The second supporting terminal includes a second helical electrically conductive portion 12 extending in a second axial direction 12dx of a winding axis 12x along main surface 1s. Second axial direction 12dx of winding axis 12x is also along second main surface 112. In the first preferred embodiment, the second supporting terminal includes only second helical electrically conductive portion 12.

That is, each of the first supporting terminal and the second supporting terminal includes a winding. In the first preferred embodiment, as shown in FIG. 1, each of first axial direction 11dx of winding axis 11x of the first supporting terminal and second axial direction 12dx of winding axis 12x of the second supporting terminal is along width direction W.

As shown in FIG. 5, first helical electrically conductive portion 11 has an outer peripheral side surface 11s. Second helical electrically conductive portion 12 has an outer peripheral side surface 12s.

In the description below, the expression "directly connected by an electrically conductive bonding material" means that components are connected to each other with no element other than the electrically conductive bonding material being provided between the components.

As shown in FIGS. 1 to 4, first helical electrically conductive portion 11 is electrically connected to first outer electrode 120 at outer peripheral side surface 11s of first helical electrically conductive portion 11. The first supporting terminal is directly connected to first outer electrode 120 by an electrically conductive bonding material 4. First helical electrically conductive portion 11 is electrically connected to first land 2 at outer peripheral side surface 11s of first helical electrically conductive portion 11. The first supporting terminal is directly connected to first land 2 by an electrically conductive bonding material 6.

In the first preferred embodiment, the first supporting terminal is provided between first land 2 and a portion of first outer electrode 120 located on second main surface 112. That is, the first supporting terminal is connected to the portion of first outer electrode 120 located on second main surface 112. When viewed in height direction T, the first supporting terminal is located to overlap with first outer electrode 120. The first supporting terminal may be provided between first land 2 and a portion of first outer electrode 120 located on first end surface 115. That is, the first supporting terminal may be connected to the portion of first outer electrode 120 located on first end surface 115.

Second helical electrically conductive portion 12 is electrically connected to second outer electrode 130 at outer peripheral side surface 12s of second helical electrically conductive portion 12. The second supporting terminal is directly connected to second outer electrode 130 by an electrically conductive bonding material 5. Second helical electrically conductive portion 12 is electrically connected to second land 3 at outer peripheral side surface 12s of second helical electrically conductive portion 12. The second supporting terminal is directly connected to second land 3 by an electrically conductive bonding material 7.

In the first preferred embodiment, the second supporting terminal is provided between second land 3 and a portion of second outer electrode 130 located on second main surface 112. That is, the second supporting terminal is connected to the portion of second outer electrode 130 located on second main surface 112. When viewed in height direction T, the second supporting terminal is located to overlap with second outer electrode 130. The second supporting terminal may be provided between second land 3 and the portion of second outer electrode 130 located on second end surface 116. That is, the second supporting terminal may be connected to the portion of second outer electrode 130 located on second end surface 116.

In the first preferred embodiment, each turn of first helical electrically conductive portion 11 has one side in height direction T connected to first outer electrode 120, each turn of first helical electrically conductive portion 11 has the other side in height direction T connected to first land 2, and each turn of first helical electrically conductive portion 11 has an intermediate portion in height direction T separated from each of first outer electrode 120 and first land 2.

Each turn of second helical electrically conductive portion 12 has one side in height direction T connected to second outer electrode 130, each turn of second helical electrically conductive portion 12 has the other side in height direction T connected to second land 3, and each turn of second helical electrically conductive portion 12 has an intermediate portion in height direction T separated from each of second outer electrode 130 and second land 3.

When a solder is included as each of electrically conductive bonding material 4, electrically conductive bonding material 5, electrically conductive bonding material 6 and electrically conductive bonding material 7, a lead-free solder is preferably included, for example, a Sn—Sb-based solder, a Sn—Ag—Cu-based solder, a Sn—Cu-based solder, or a Sn—Bi-based solder. When the Sn—Sb solder is included, the content of Sb is preferably about more than or equal to about 5% and less than or equal to about 15%, for example.

Each of first helical electrically conductive portion 11 and second helical electrically conductive portion 12 includes a round wire having a diameter of more than or equal to about 0.1 mm and less than or equal to about 0.5 mm. Each of first helical electrically conductive portion 11 and second helical electrically conductive portion 12 includes stainless steel or phosphor bronze. Preferably, each of first helical electrically conductive portion 11 and second helical electrically conductive portion 12 is provided with at least one of Ni plating and Sn plating, for example. However, the wire material of each of first helical electrically conductive portion 11 and second helical electrically conductive portion 12 is not limited to the materials described above.

In supporting-terminal-equipped capacitor chip 10 according to the first preferred embodiment of the present invention, the first supporting terminal includes first helical electrically conductive portion 11 extending in first axial direction 11dx of winding axis 11x along main surface 1s, and first helical electrically conductive portion 11 is electrically connected to first outer electrode 120 at outer peripheral side surface 11s of first helical electrically conductive portion 11. The second supporting terminal includes second helical electrically conductive portion 12 extending in second axial direction 12dx of winding axis 12x along main surface 1s, and second helical electrically conductive portion 12 is electrically connected to second outer electrode 130 at outer peripheral side surface 12s of second helical electrically conductive portion 12.

Accordingly, vibration resulting from strain of capacitor chip 100 when voltage is applied is able to be damped by first helical electrically conductive portion 11 and second helical electrically conductive portion 12, thus reducing acoustic noise. Further, by connecting outer peripheral side surface 11s of first helical electrically conductive portion 11 to first outer electrode 120 with winding axis 11x being along main surface 1s and by connecting outer peripheral side surface 12s of second helical electrically conductive portion 12 to second outer electrode 130 with winding axis 12x being along main surface 1s, the height dimension and the length size of supporting-terminal-equipped capacitor chip 10 are able to be significantly reduced, thus significantly reducing the occupied space of supporting-terminal-equipped capacitor chip 10. Further, mounting stability is able to be significantly improved as compared with a case where first helical electrically conductive portion 11 is located and oriented with winding axis 11x orthogonal or substantially orthogonal to main surface 1s and second helical electrically conductive portion 12 is located and oriented with winding axis 12x orthogonal or substantially orthogonal to main surface 1s.

In the mounted structure of supporting-terminal-equipped capacitor chip 10 according to the first preferred embodiment of the present invention, the first supporting terminal is provided between first land 2 and the portion of first outer electrode 120 located on second main surface 112, and the second supporting terminal is provided between second land 3 and the portion of second outer electrode 130 located on second main surface 112. That is, the first supporting terminal is connected to the portion of first outer electrode 120 located on second main surface 112, and the second supporting terminal is connected to the portion of second outer electrode 130 located on second main surface 112.

Accordingly, the length size of supporting-terminal-equipped capacitor chip 10 is able to be significantly reduced, thus significantly reducing the occupied space of supporting-terminal-equipped capacitor chip 10.

In the mounted structure of supporting-terminal-equipped capacitor chip 10 according to the first preferred embodiment of the present invention, the first supporting terminal is directly connected to first land 2 by electrically conductive bonding material 6, and the second supporting terminal is directly connected to second land 3 by electrically conductive bonding material 7.

Accordingly, the height dimension of supporting-terminal-equipped capacitor chip 10 is able to be significantly reduced, thus significantly reducing the occupied space of supporting-terminal-equipped capacitor chip 10. In addition, the mounted structure of supporting-terminal-equipped capacitor chip 10 is able to be simplified.

In supporting-terminal-equipped capacitor chip 10 according to the first preferred embodiment of the present invention, the first supporting terminal is directly connected to first outer electrode 120 by electrically conductive bonding material 4, and the second supporting terminal is directly connected to second outer electrode 130 by electrically conductive bonding material 5. That is, the first supporting terminal includes only first helical electrically conductive portion 11, and the second supporting terminal includes only second helical electrically conductive portion 12.

Accordingly, the height dimension of supporting-terminal-equipped capacitor chip 10 is able to be significantly reduced, thus significantly reducing the occupied space of supporting-terminal-equipped capacitor chip 10. In addition, the mounted structure of supporting-terminal-equipped capacitor chip 10 is able to be further simplified.

In supporting-terminal-equipped capacitor chip 10 according to the first preferred embodiment of the present invention, each of first axial direction 11dx of winding axis 11x of the first supporting terminal and second axial direction 12dx of winding axis 12x of the second supporting terminal is along width direction W. Accordingly, the length size of supporting-terminal-equipped capacitor chip 10 is able to be significantly reduced, thus significantly reducing the occupied space of supporting-terminal-equipped capacitor chip 10.

A supporting-terminal-equipped capacitor chip according to a second preferred embodiment of the present invention is described below. The supporting-terminal-equipped capacitor chip according to the second preferred embodiment of the present invention is different from supporting-terminal-equipped capacitor chip 10 according to the first preferred embodiment of the present invention only in terms of a form of connection of each of the first supporting terminal and the second supporting terminal. Therefore, the same or similar features as those of supporting-terminal-equipped capacitor chip 10 according to the first preferred embodiment of the present invention will not be repeatedly described.

Figure 6:
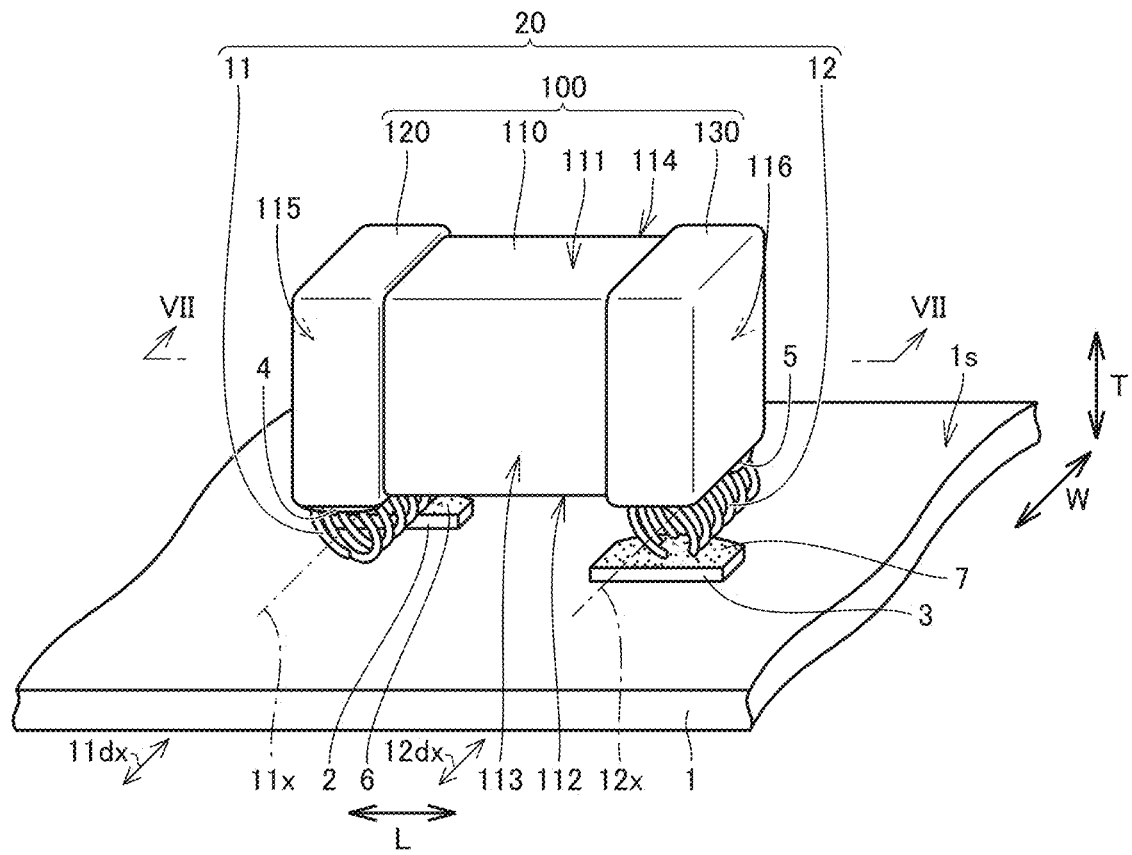
FIG. 6 is a perspective view showing a mounted structure of a supporting-terminal-equipped capacitor chip according to a second preferred embodiment of the present invention.
Figure 7:
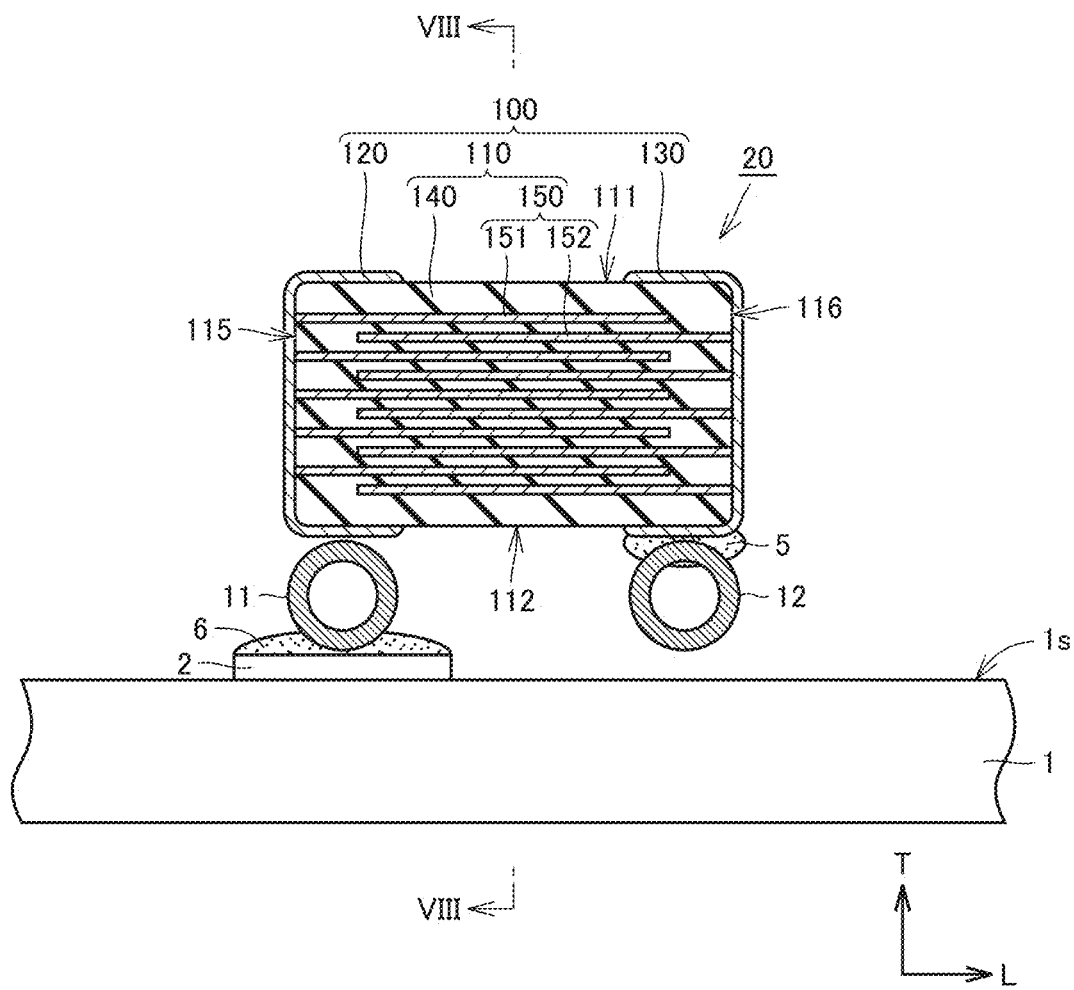
FIG. 7 is a cross sectional view showing the mounted structure of the supporting-terminal-equipped capacitor chip of FIG. 6 when viewed in a direction of a line arrow VII-VII.
Figure 8:
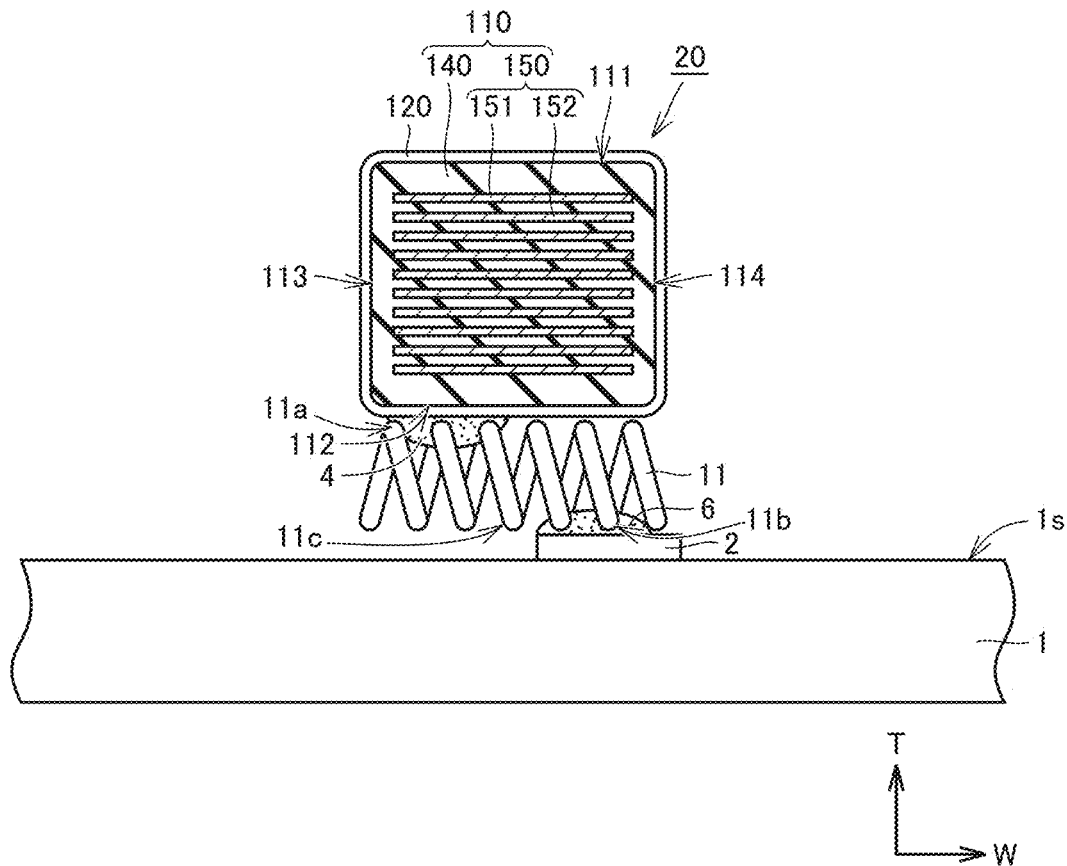
FIG. 8 is a cross sectional view showing the mounted structure of the supporting-terminal-equipped capacitor chip of FIG. 7 when viewed in a direction of a line arrow VIII-VIII.
Figure 9:
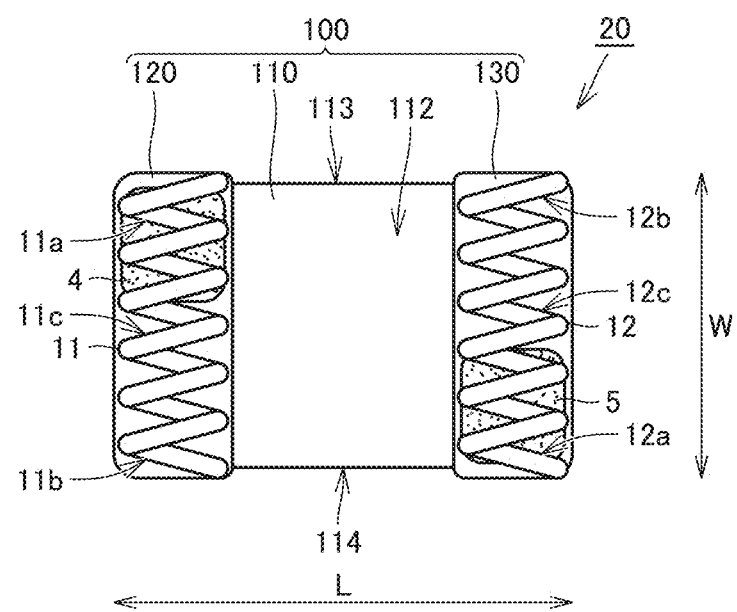
FIG. 9 is a diagram showing the supporting-terminal-equipped capacitor chip according to the second preferred embodiment of the present invention when viewed from the second main surface side.

FIG. 6 is a perspective view showing a mounted structure of the supporting-terminal-equipped capacitor chip according to the second preferred embodiment of the present invention. FIG. 7 is a cross sectional view showing the mounted structure of the supporting-terminal-equipped capacitor chip of FIG. 6 when viewed in a direction of a line arrow VII-VII. FIG. 8 is a cross sectional view showing the mounted structure of the supporting-terminal-equipped capacitor chip of FIG. 7 when viewed in a direction of a line arrow VIII-VIII. FIG. 9 is a diagram showing the supporting-terminal-equipped capacitor chip according to the second preferred embodiment of the present invention when viewed from the second main surface side.

As shown in FIGS. 6 to 9, in the mounted structure of supporting-terminal-equipped capacitor chip 20 according to the second preferred embodiment of the present invention, a portion of first helical electrically conductive portion 11 on one side in width direction W has one side in height direction T connected to first outer electrode 120, a portion of first helical electrically conductive portion 11 on the other side in width direction W has the other side in height direction T connected to first land 2, and first helical electrically conductive portion 11 has an intermediate portion in width direction W separated from each of first outer electrode 120 and first land 2.

That is, first helical electrically conductive portion 11 has a first electrode connection portion 11a connected to first outer electrode 120, a first land connection portion 11b connected to first land 2, and a first intermediate portion 11c that links first electrode connection portion 11a to first land connection portion 11b. First electrode connection portion 11a and first land connection portion 11b are side by side in first axial direction 11dx of winding axis 11x. First intermediate portion 11c has a loop shape and is separated from each of first outer electrode 120 and first land 2. First intermediate portion 11c is a portion of first helical electrically conductive portion 11 with one or more turns.

A portion of second helical electrically conductive portion 12 on the other side in width direction W has one side in height direction T connected to second outer electrode 130, a portion of second helical electrically conductive portion 12 on one side in width direction W has the other side in height direction T connected to second land 3, and second helical electrically conductive portion 12 has an intermediate portion in width direction W separated from each of second outer electrode 130 and second land 3.

That is, second helical electrically conductive portion has a second electrode connection portion 12a connected to second outer electrode 130, a second land connection portion 12b connected to second land 3, and a second intermediate portion 12c that links second electrode connection portion 12a to second land connection portion 12b. Second electrode connection portion 12a and second land connection portion 12b are side by side in second axial direction 12dx of winding axis 12x. Second intermediate portion 12c has a loop shape and is separated from each of second outer electrode 130 and second land 3. Second intermediate portion 12c is a portion of second helical electrically conductive portion 12 with one or more turns.

In the mounted structure of supporting-terminal-equipped capacitor chip 20 according to the second preferred embodiment of the present invention, since first intermediate portion 11c having a loop shape is provided at first helical electrically conductive portion 11, vibration propagated from first electrode connection portion 11a toward first land connection portion 11b is able to be damped by first intermediate portion 11c, which is not fixed and has a low elastic modulus. Accordingly, acoustic noise is able to be significantly reduced.

Similarly, since second intermediate portion 12c having a loop shape is provided at second helical electrically conductive portion 12, vibration propagated from second electrode connection portion 12a toward second land connection portion 12b is able to be damped by second intermediate portion 12c, which is not fixed and has a low elastic modulus. Accordingly, acoustic noise is able to be significantly reduced.

A supporting-terminal-equipped capacitor chip according to a third preferred embodiment of the present invention is described below. The supporting-terminal-equipped capacitor chip according to the third preferred embodiment of the present invention is different from supporting-terminal-equipped capacitor chip 20 according to the second preferred embodiment of the present invention mainly in terms of the axial direction of the winding axis of each of the first supporting terminal and the second supporting terminal. Therefore, the same or similar features as those of supporting-terminal-equipped capacitor chip 20 according to the second preferred embodiment of the present invention will not be repeatedly described.

Figure 10:
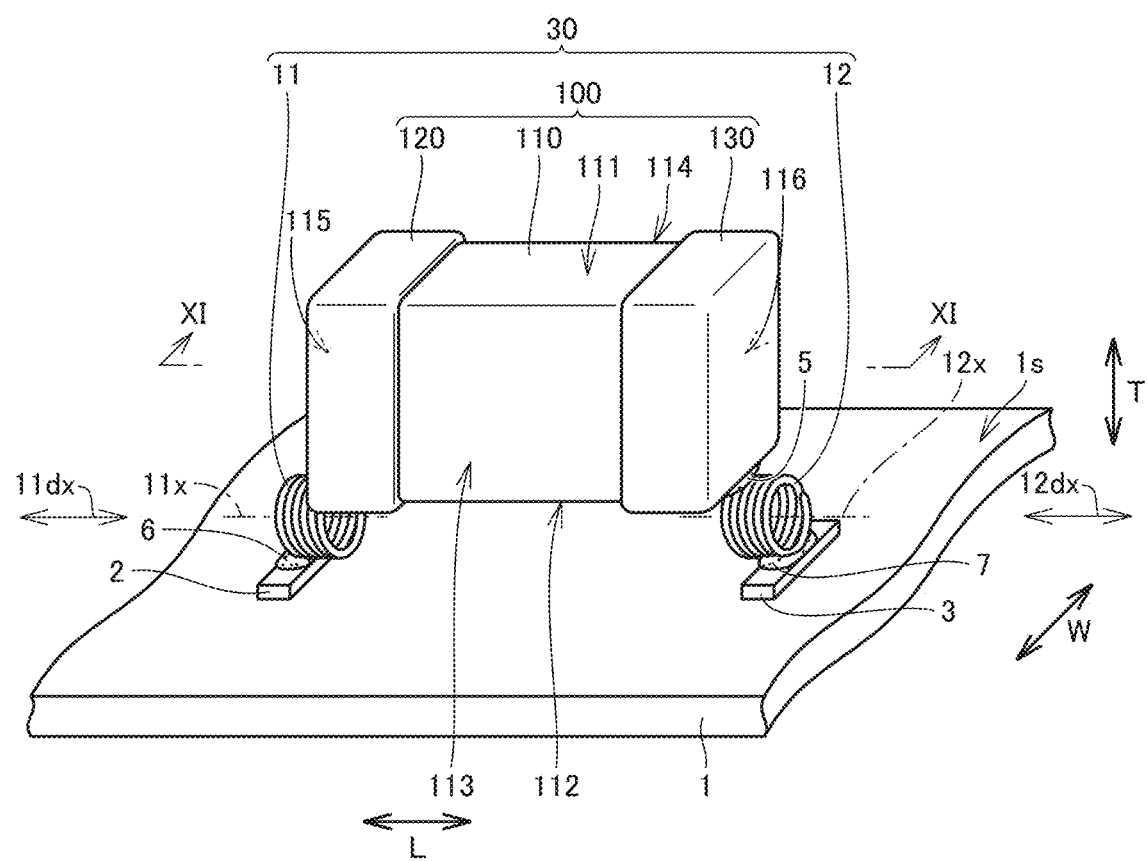
FIG. 10 is a perspective view showing a mounted structure of a supporting-terminal-equipped capacitor chip according to a third preferred embodiment of the present invention.
Figure 11:
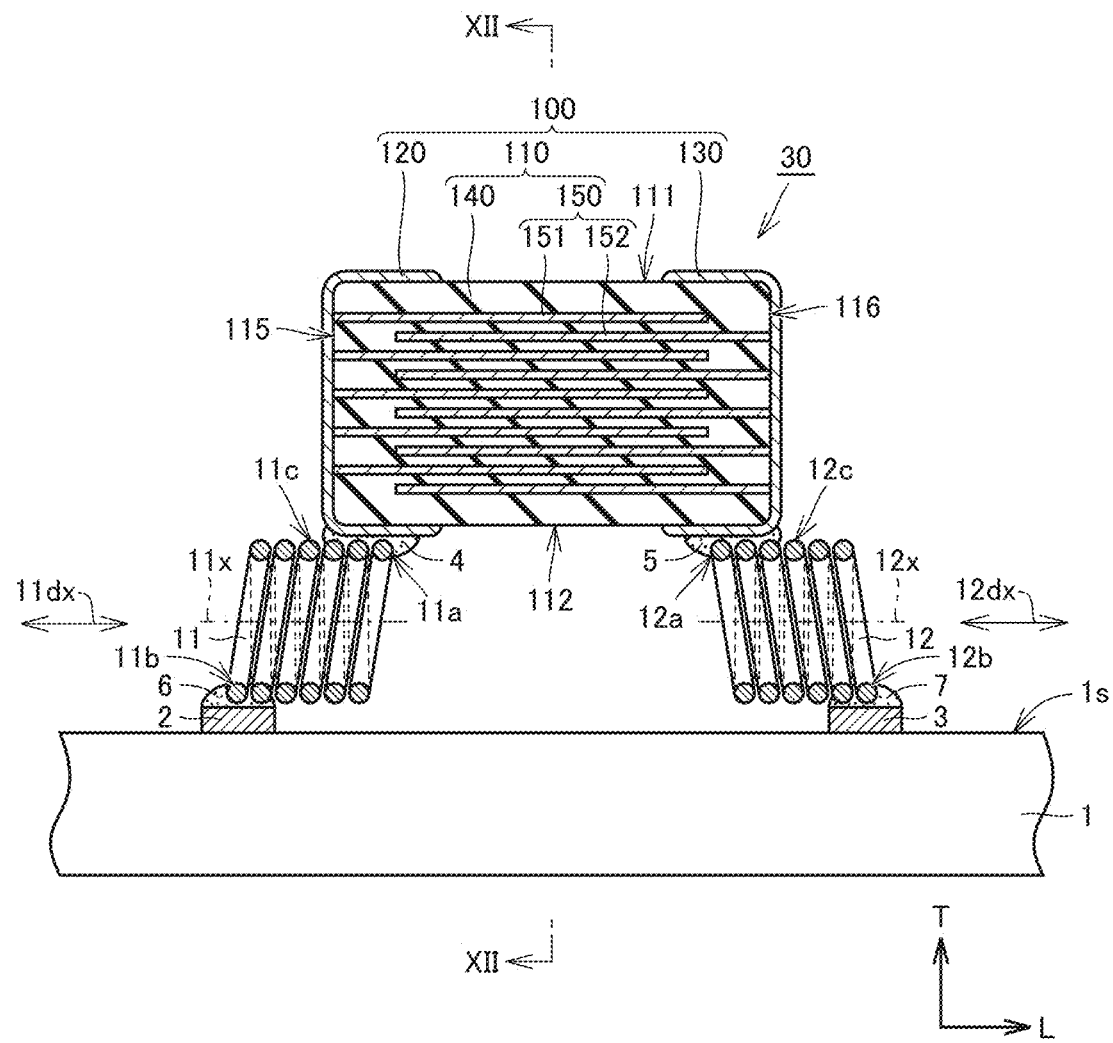
FIG. 11 is a cross sectional view showing the mounted structure of the supporting-terminal-equipped capacitor chip of FIG. 10 when viewed in a direction of a line arrow XI-XI.
Figure 12:
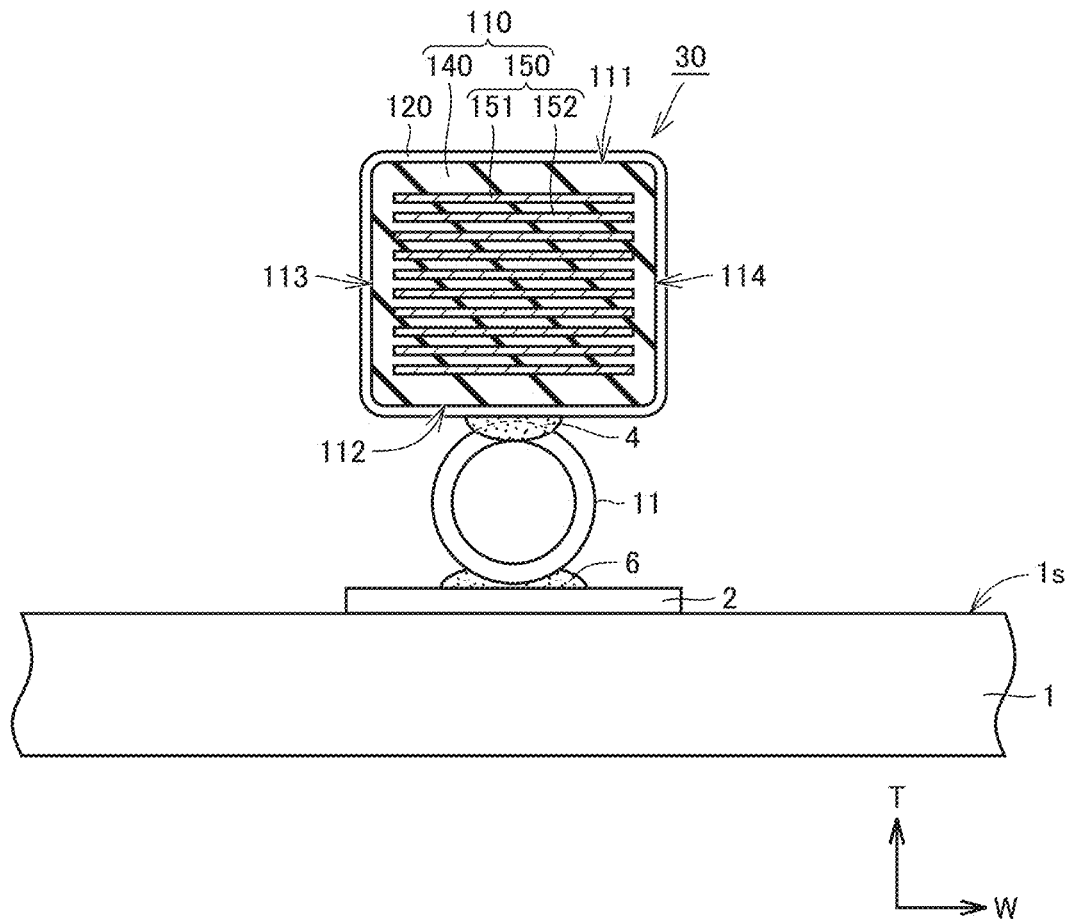
FIG. 12 is a cross sectional view showing the mounted structure of the supporting-terminal-equipped capacitor chip of FIG. 11 when viewed in a direction of a line arrow XII-XII.
Figure 13:
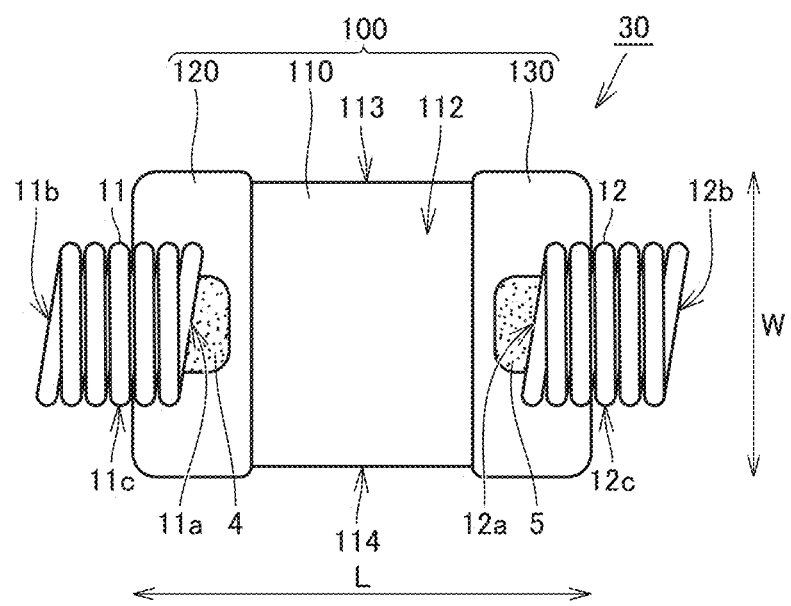
FIG. 13 is a diagram showing the supporting-terminal-equipped capacitor chip according to the third preferred embodiment of the present invention when viewed from the second main surface side.

FIG. 10 is a perspective view showing a mounted structure of the supporting-terminal-equipped capacitor chip according to the third preferred embodiment of the present invention. FIG. 11 is a cross sectional view showing the mounted structure of the supporting-terminal-equipped capacitor chip of FIG. 10 when viewed in a direction of a line arrow XI-XI. FIG. 12 is a cross sectional view showing the mounted structure of the supporting-terminal-equipped capacitor chip of FIG. 11 when viewed in a direction of a line arrow XII-XII. FIG. 13 is a diagram showing the supporting-terminal-equipped capacitor chip according to the third preferred embodiment of the present invention when viewed from the second main surface side.

As shown in FIGS. 10 to 13, in a mounted structure of a supporting-terminal-equipped capacitor chip 30 according to the third preferred embodiment of the present invention, each of first axial direction 11dx of winding axis 11x of the first supporting terminal and second axial direction 12dx of winding axis 12x of the second supporting terminal is along length direction L.

The first supporting terminal is provided between first land 2 and a portion of first outer electrode 120 located on second main surface 112. That is, the first supporting terminal is connected to the portion of first outer electrode 120 located on second main surface 112. When viewed in height direction T, a portion of the first supporting terminal on one side in length direction L is located to overlap with first outer electrode 120.

The second supporting terminal is provided between second land 3 and a portion of second outer electrode 130 located on second main surface 112. That is, the second supporting terminal is connected to the portion of second outer electrode 130 located on second main surface 112. When viewed in height direction T, a portion of the second supporting terminal on the other side in length direction L is located to overlap with second outer electrode 130.

In the mounted structure of supporting-terminal-equipped capacitor chip 30 according to the third preferred embodiment of the present invention, a portion of first helical electrically conductive portion 11 on one side in length direction L has one side in height direction T connected to first outer electrode 120, a portion of first helical electrically conductive portion 11 on the other side in length direction L has the other side in height direction T connected to first land 2, and first helical electrically conductive portion 11 has an intermediate portion in length direction L separated from each of first outer electrode 120 and first land 2.

That is, first helical electrically conductive portion 11 has a first electrode connection portion 11a connected to first outer electrode 120, a first land connection portion 11b connected to first land 2, and a first intermediate portion 11c that links first electrode connection portion 11a to first land connection portion 11b. First electrode connection portion 11a and first land connection portion 11b are provided side by side in first axial direction 11dx of winding axis 11x. First intermediate portion 11c has a loop shape and is separated from each of first outer electrode 120 and first land 2. First intermediate portion 11c is a portion of first helical electrically conductive portion 11 with one or more turns.

A portion of second helical electrically conductive portion 12 on the other side in length direction L has one side in height direction T connected to second outer electrode 130, a portion of second helical electrically conductive portion 12 on one side in length direction L has the other side in height direction T connected to second land 3, and second helical electrically conductive portion 12 has an intermediate portion in length direction L separated from each of second outer electrode 130 and second land 3.

That is, second helical electrically conductive portion has a second electrode connection portion 12a connected to second outer electrode 130, a second land connection portion 12b connected to second land 3, and a second intermediate portion 12c that links second electrode connection portion 12a to second land connection portion 12b. Second electrode connection portion 12a and second land connection portion 12b are side by side in second axial direction 12dx of winding axis 12x. Second intermediate portion 12c has a loop shape and is separated from each of second outer electrode 130 and second land 3. Second intermediate portion 12c is a portion of second helical electrically conductive portion 12 with one or more turns.

Also in the mounted structure of supporting-terminal-equipped capacitor chip 30 according to the third preferred embodiment of the present invention, since first intermediate portion 11c having a loop shape is provided at first helical electrically conductive portion 11, vibration propagated from first electrode connection portion 11a toward first land connection portion 11b is able to be damped by first intermediate portion 11c, which is not fixed and has a low elastic modulus. Accordingly, acoustic noise is able to be significantly reduced.

Similarly, since loop-shaped second intermediate portion 12c having a loop shape is provided at second helical electrically conductive portion 12, vibration propagated from second electrode connection portion 12a toward second land connection portion 12b is able to be damped by second intermediate portion 12c, which is not fixed and has a low elastic modulus. Accordingly, acoustic noise is able to be significantly reduced.

In supporting-terminal-equipped capacitor chip 30 according to the third preferred embodiment of the present invention, each of first axial direction 11dx of winding axis 11x of the first supporting terminal and second axial direction 12dx of winding axis 12x of the second supporting terminal is along length direction L. Accordingly, vibration resulting from relatively large strain in length direction L of capacitor chip 100 is able to be damped by the first supporting terminal and the second supporting terminal, thus significantly reducing acoustic noise.

Here, the following describes a first modification in which each of the first supporting terminal and the second supporting terminal has a different shape. Since the shape of the second supporting terminal is the same or substantially the same as the shape of the first supporting terminal, only the first supporting terminal will be described while the second supporting terminal will not be repeatedly described.

Figure 14:
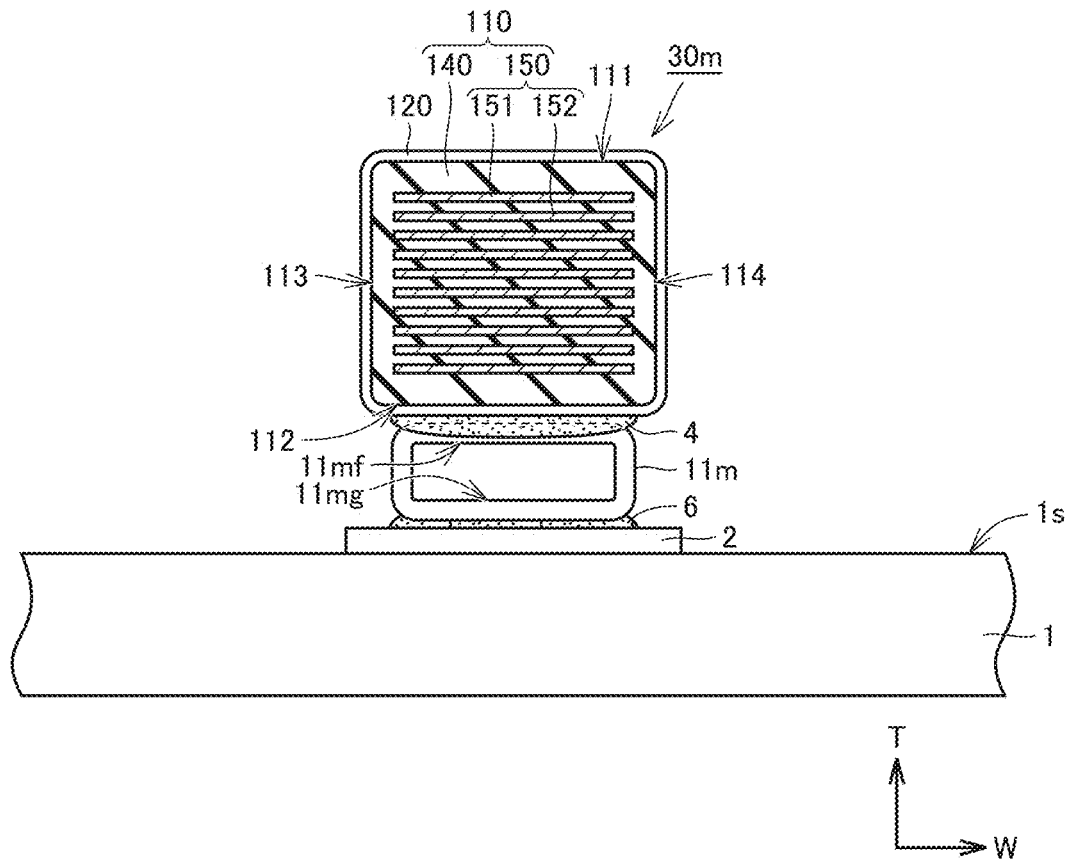
FIG. 14 is a cross sectional view showing a mounted structure of a supporting-terminal-equipped capacitor chip according to a first modification of the third preferred embodiment of the present invention.

FIG. 14 is a cross sectional view showing a mounted structure of a supporting-terminal-equipped capacitor chip according to the first modification of the third preferred embodiment of the present invention. FIG. 14 shows a cross section similar to the cross section shown in FIG. 12.

As shown in FIG. 14, in a supporting-terminal-equipped capacitor chip 30m according to the first modification of the third preferred embodiment of the present invention, a first helical electrically conductive portion 11m includes first facing portions facing each other with a space provided between the first facing portions when viewed in the first axial direction. The first facing portions include a linear extending portion 11mf extending along second main surface 112 and a linear extending portion 11mg located with a space provided between linear extending portion 11mg and linear extending portion 11mf in height direction T. Similarly, the second helical electrically conductive portion includes second facing portions facing each other with a space provided between the second facing portions when viewed in the second axial direction.

In the mounted structure of supporting-terminal-equipped capacitor chip 30m according to the first modification of the third preferred embodiment of the present invention, the mounting stability of supporting-terminal-equipped capacitor chip 30m is able to be significantly improved by providing the first facing portions between first outer electrode 120 and first land 2 and providing the second facing portions between second outer electrode 130 and second land 3.

Here, the following describes a second modification in which different numbers of the first and second supporting terminals are provided.

Figure 15:
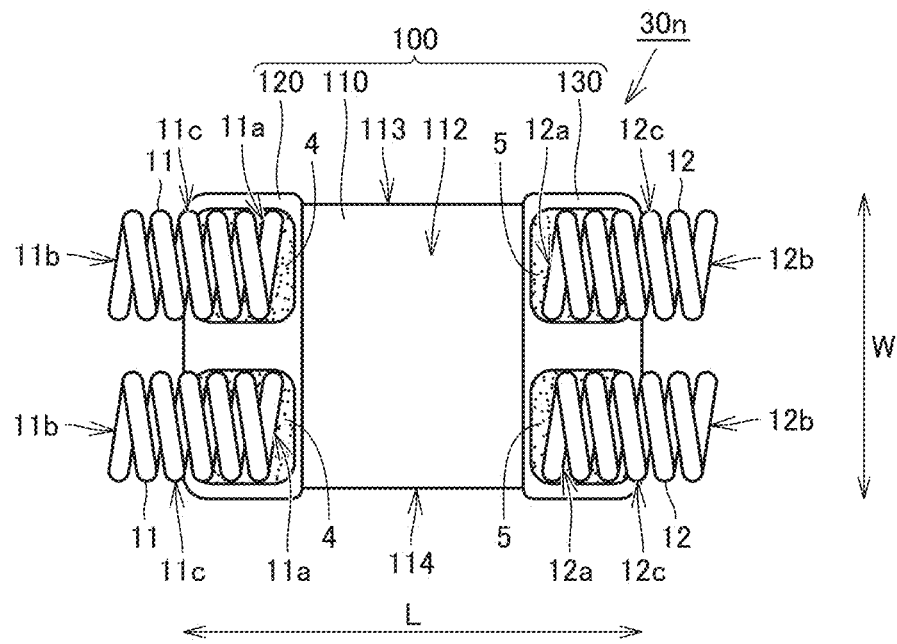
FIG. 15 is a diagram showing the supporting-terminal-equipped capacitor chip according to a second modification of the third preferred embodiment of the present invention when viewed from the second main surface side.

FIG. 15 is a diagram showing a supporting-terminal-equipped capacitor chip according to the second modification of the third preferred embodiment of the present invention when viewed from the second main surface side. As shown in FIG. 15, in a supporting-terminal-equipped capacitor chip 30n according to the second modification of the third preferred embodiment of the present invention, two first helical electrically conductive portions 11 are located side by side with a space provided between the two first helical electrically conductive portions 11 in width direction W and are connected to first outer electrode 120, and two second helical electrically conductive portions 12 are located side by side with a space provided between the two second helical electrically conductive portions 12 in width direction W and are connected to second outer electrode 130.

In the mounted structure of supporting-terminal-equipped capacitor chip 30n according to the second modification of the third preferred embodiment of the present invention, the mounting stability of supporting-terminal-equipped capacitor chip 30n is able to be significantly improved by providing two first helical electrically conductive portions 11 between first outer electrode 120 and first land 2 and by providing two second helical electrically conductive portions 12 between second outer electrode 130 and second land 3.

A supporting-terminal-equipped capacitor chip according to a fourth preferred embodiment of the present invention is described below. The supporting-terminal-equipped capacitor chip according to the fourth preferred embodiment of the present invention is different from supporting-terminal-equipped capacitor chip 10 according to the first preferred embodiment of the present invention mainly in terms of the shape of each of the first supporting terminal and the second supporting terminal. Therefore, the same or similar features as those of supporting-terminal-equipped capacitor chip 10 according to the first preferred embodiment of the present invention will not be repeatedly described.

Figure 16:
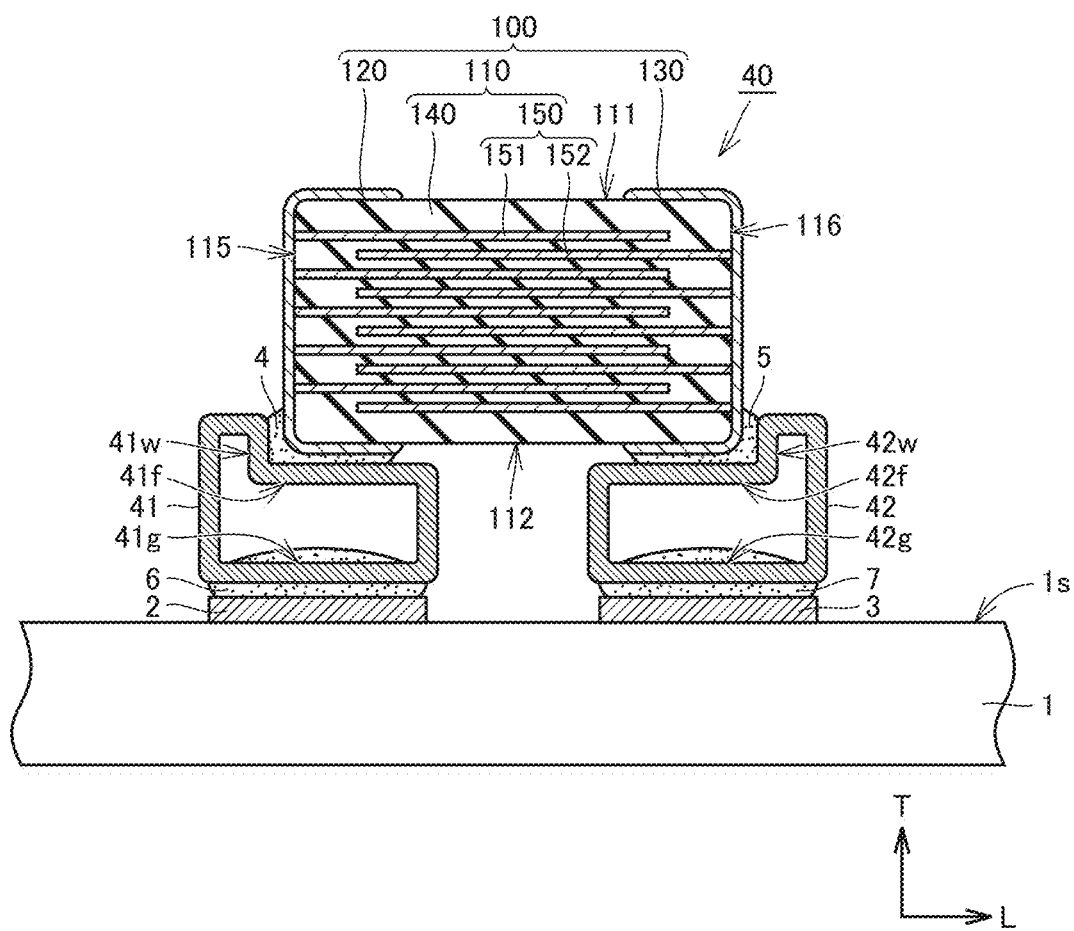
FIG. 16 is a cross sectional view showing a mounted structure of a supporting-terminal-equipped capacitor chip according to a fourth preferred embodiment of the present invention.

FIG. 16 is a cross sectional view showing the mounted structure of the supporting-terminal-equipped capacitor chip according to the fourth preferred embodiment of the present invention. FIG. 16 shows a cross section similar to the cross section shown in FIG. 2.

As shown in FIG. 16, in supporting-terminal-equipped capacitor chip 40 according to the fourth preferred embodiment of the present invention, first helical electrically conductive portion 41 includes first facing portions facing each other with a space being provided between the first facing portions when viewed in the first axial direction. The first facing portions include a linear extending portion 41f extending along second main surface 112 and a linear extending portion 41g located with a space provided between linear extending portion 41g and linear extending portion 41f in height direction T.

First helical electrically conductive portion 41 further includes a rising portion 41w extending along first end surface 115 from another end of linear extending portion 41f in length direction L when viewed in the first axial direction.

Similarly, second helical electrically conductive portion 42 includes second facing portions facing each other with a space provided between the second facing portions when viewed in the second axial direction. The second facing portions include a linear extending portion 42f extending along second main surface 112 and a linear extending portion 42g located with a space being provided between linear extending portion 42g and linear extending portion 42f in height direction T.

Second helical electrically conductive portion 42 further includes a rising portion 42w extending along second end surface 116 from one end of linear extending portion 42f in length direction L when viewed in the second axial direction.

In the mounted structure of supporting-terminal-equipped capacitor chip 40 according to the fourth preferred embodiment of the present invention, the mounting stability of supporting-terminal-equipped capacitor chip 40 is able to be significantly improved by providing the first facing portions between first outer electrode 120 and first land 2 and by providing the second facing portions between second outer electrode 130 and second land 3.

Further, first outer electrode 120 and first helical electrically conductive portion 41 are connected to each other with first end surface 115 and rising portion 41w facing each other and linear extending portion 41f and second main surface 112 facing each other, and second outer electrode 130 and second helical electrically conductive portion 42 are connected to each other with second end surface 116 and rising portion 42w facing each other and linear extending portion 42f and second main surface 112 facing each other, and thus the mounting stability and connection reliability of supporting-terminal-equipped capacitor chip 40 are able to be significantly improved.

A supporting-terminal-equipped capacitor chip according to a fifth preferred embodiment of the present invention is described below. The supporting-terminal-equipped capacitor chip according to the fifth preferred embodiment of the present invention is different from supporting-terminal-equipped capacitor chip 10 according to the first preferred embodiment of the present invention mainly in terms of the shape of each of the first supporting terminal and the second supporting terminal as well as inclusion of a pair of first electrically conductive plates and a pair of second electrically conductive plates. Therefore, the same or similar features as those of the supporting-terminal-equipped capacitor chip 10 according to the first preferred embodiment of the present invention will not be repeatedly described.

Figure 17:
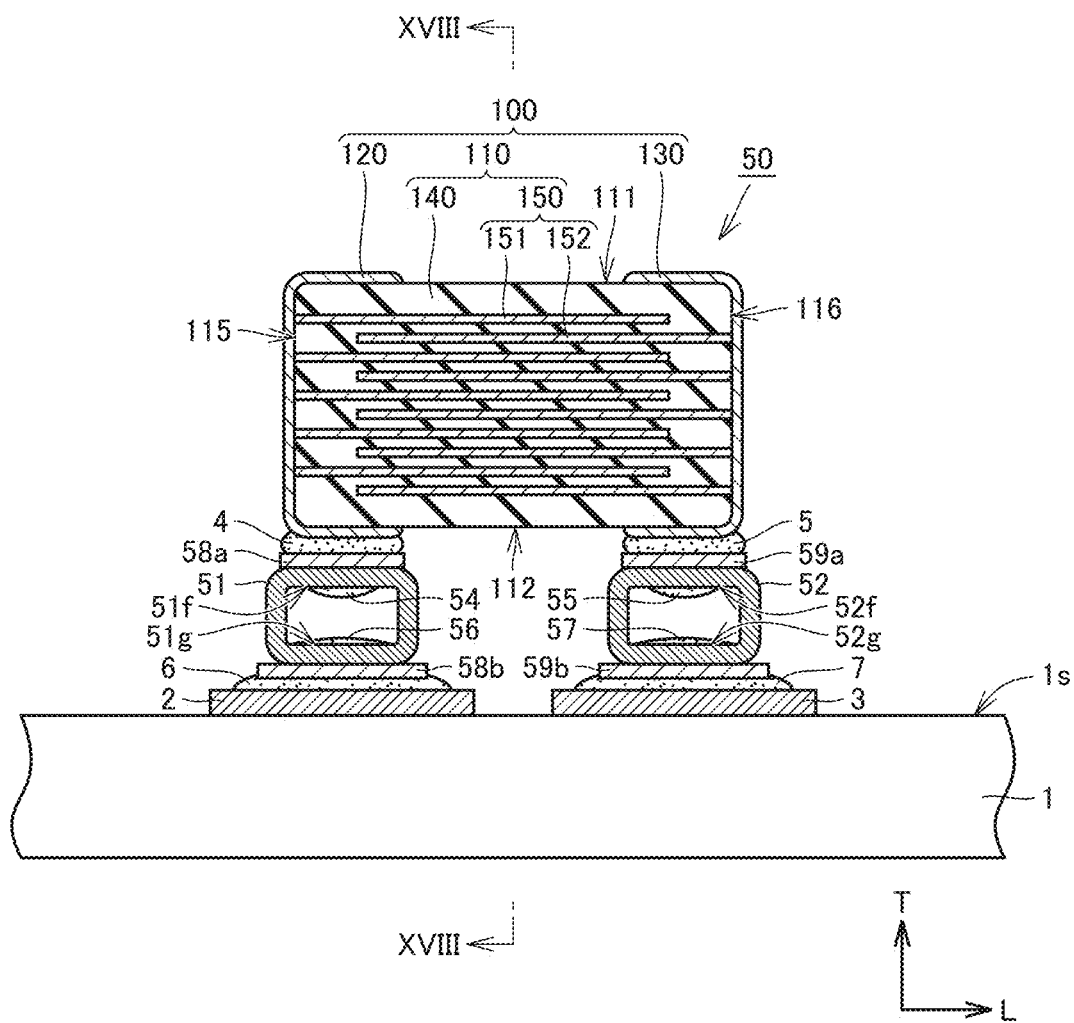
FIG. 17 is a cross sectional view showing a mounted structure of a supporting-terminal-equipped capacitor chip according to a fifth preferred embodiment of the present invention.
Figure 18:
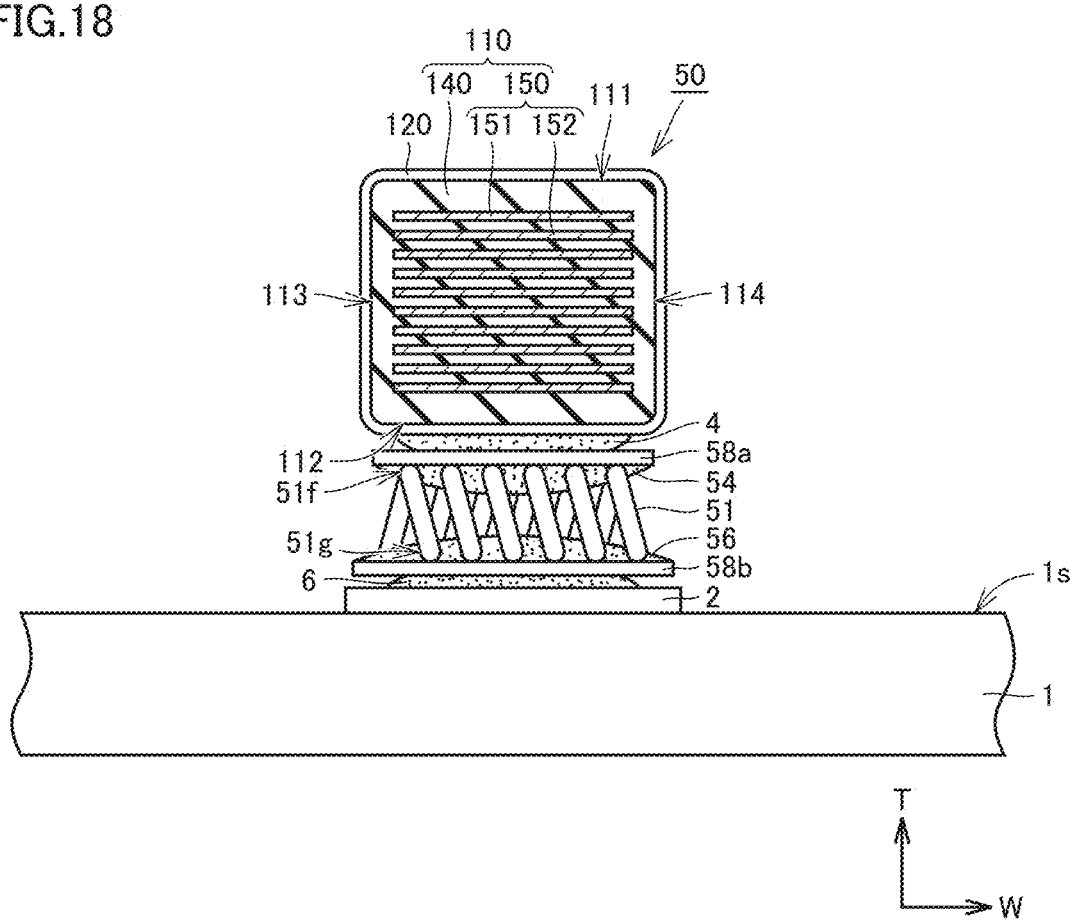
FIG. 18 is a cross sectional view showing the mounted structure of the supporting-terminal-equipped capacitor chip of FIG. 17 when viewed in a direction of a line arrow XVIII-XVIII.

FIG. 17 is a cross sectional view showing the mounted structure of the supporting-terminal-equipped capacitor chip according to the fifth preferred embodiment of the present invention. FIG. 18 is a cross sectional view showing the mounted structure of the supporting-terminal-equipped capacitor chip of FIG. 17 when viewed in a direction of a line arrow XVIII-XVIII. FIG. 17 shows a cross section similar to the cross section shown in FIG. 2.

As shown in FIGS. 17 and 18, in supporting-terminal-equipped capacitor chip 50 according to the fifth preferred embodiment of the present invention, first helical electrically conductive portion 51 includes first facing portions facing each other with a space provided between the first facing portions when viewed in the first axial direction. The first facing portions include a linear extending portion 51f extending along second main surface 112 and a linear extending portion 51g with a space provided between linear extending portion 51g and linear extending portion 51f in height direction T.

Similarly, second helical electrically conductive portion 52 includes second facing portions facing each other with a space provided between the second facing portions when viewed in the second axial direction. The second facing portions include a linear extending portion 52f extending along second main surface 112 and a linear extending portion 52g with a space provided between linear extending portion 52g and linear extending portion 52f in height direction T.

The first supporting terminal further includes a pair of first electrically conductive plates 58a, 58b that sandwich first helical electrically conductive portion 51 therebetween when viewed in the first axial direction. Each of the pair of first electrically conductive plates 58a, 58b has a flat plate shape. The second supporting terminal further includes a pair of second electrically conductive plates 59a, 59b that sandwich second helical electrically conductive portion 52 therebetween when viewed in the second axial direction. Each of the pair of second electrically conductive plates 59a, 59b has a flat plate shape.

One surface of first electrically conductive plate 58a is connected to first outer electrode 120 by electrically conductive bonding material 4. The other surface of first electrically conductive plate 58a is connected to linear extending portion 51f by an electrically conductive bonding material 54. That is, first helical electrically conductive portion 51 is electrically connected to first outer electrode 120 at the outer peripheral side surface of first helical electrically conductive portion 51 via first electrically conductive plate 58a. The first supporting terminal is provided between first land 2 and a portion of first outer electrode 120 located on second main surface 112. The first supporting terminal is connected to the portion of first outer electrode 120 located on second main surface 112 via first electrically conductive plate 58a. The first supporting terminal is indirectly connected to first outer electrode 120 by electrically conductive bonding materials 4, 54.

One surface of first electrically conductive plate 58b is connected to first land 2 by electrically conductive bonding material 6. The other surface of first electrically conductive plate 58b is connected to linear extending portion 51g by an electrically conductive bonding material 56.

One surface of second electrically conductive plate 59a is connected to second outer electrode 130 by electrically conductive bonding material 5. The other surface of second electrically conductive plate 59a is connected to linear extending portion 52f by an electrically conductive bonding material 55. That is, second helical electrically conductive portion 52 is electrically connected to second outer electrode 130 at the outer peripheral side surface of second helical electrically conductive portion 52 via second electrically conductive plate 59a. The second supporting terminal is provided between second land 3 and a portion of second outer electrode 130 located on second main surface 112. The second supporting terminal is connected to the portion of second outer electrode 130 located on second main surface 112 via second electrically conductive plate 59a. The second supporting terminal is indirectly connected to second outer electrode 130 by electrically conductive bonding materials 5, 55.

One surface of second electrically conductive plate 59b is connected to second land 3 by electrically conductive bonding material 7. The other surface of second electrically conductive plate 59b is connected to linear extending portion 52g by an electrically conductive bonding material 57.

Each of the pair of first electrically conductive plates 58a, 58b and the pair of second electrically conductive plates 59a, 59b includes a main body portion and a plating layer formed on a surface of the main body portion.

The main body portion preferably includes Ni, Fe, Cu, Ag, Cr, or an alloy including one or more of these metals as a main component, for example. Specifically, as a base material of the main body portion, for example, an Fe-18Cr alloy, an Fe-42Ni alloy, a Cu-8Sn alloy, or the like may be included. The thickness of the main body portion is preferably about more than or equal to about 0.05 mm and less than or equal to about 0.5 mm, for example.

The plating layer preferably includes a lower plating layer formed on the surface of the main body portion and an upper plating layer formed on a surface of the lower plating layer, for example. Each of the lower plating layer and the upper plating layer may include a plurality of plating layers. The thickness of the lower plating layer is preferably about more than or equal to about 0.2 μm and less than or equal to about 5.0 μm, for example. The thickness of the upper plating layer is preferably about more than or equal to about 1.0 μm and less than or equal to about 5.0 μm, for example.

The lower plating layer includes Ni, Fe, Cu, Ag, Cr, or an alloy including one or more of these metals as a main component. Preferably, for example, the lower plating layer includes Ni, Fe, Cr, or an alloy including one or more of these metals as a main component.

The upper plating layer includes Sn, Ag, Au, or an alloy including one or more of these metals as a main component. Preferably, for example, the upper plating layer includes Sn or an alloy including Sn as a main component. Since the upper plating layer includes Sn or the alloy including Sn as a main component, the pair of first electrically conductive plates 58a, 58b, and the pair of second electrically conductive plates 59a, 59b are able to be provided with significantly increased solder wettability.

When a solder is included as each of electrically conductive bonding material 54, electrically conductive bonding material 55, electrically conductive bonding material 56 and electrically conductive bonding material 57, a lead-free solder, for example, a Sn—Sb-based solder, a Sn—Ag—Cu-based solder, a Sn—Cu-based solder, or a Sn—Bi-based solder is preferably applied. When the Sn—Sb solder is included, the content of Sb is preferably about more than or equal to about 5% and less than or equal to about 15%, for example.

In the mounted structure of supporting-terminal-equipped capacitor chip 50 according to the fifth preferred embodiment of the present invention, the mounting stability of supporting-terminal-equipped capacitor chip 50 is able to be significantly improved by providing the first facing portions and the pair of first electrically conductive plates 58a, 58b between first outer electrode 120 and first land 2 and by providing the second facing portions and the pair of second electrically conductive plates 59a, 59b between second outer electrode 130 and second land 3.

Here, the following describes a modification in which each of one first electrically conductive plate and one second electrically conductive plate has a different shape. Since the shape of the second electrically conductive plate is the same or substantially the same as that of the first electrically conductive plate, only the first electrically conductive plate will be described while the second electrically conductive plate will not be repeatedly described.

Figure 19:
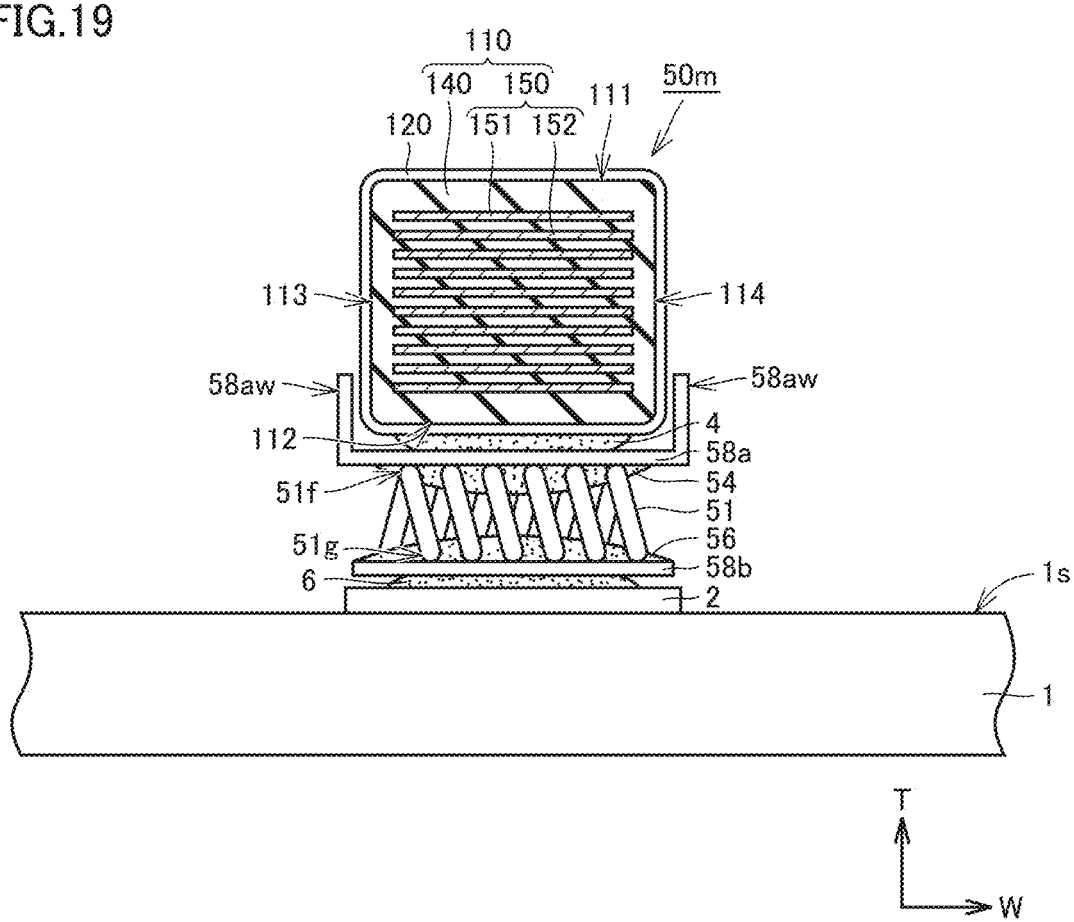
FIG. 19 is a cross sectional view showing a mounted structure of a supporting-terminal-equipped capacitor chip according to a modification of the fifth preferred embodiment of the present invention.

FIG. 19 is a cross sectional view showing a mounted structure of a supporting-terminal-equipped capacitor chip according to the modification of the fifth preferred embodiment of the present invention. FIG. 19 shows a cross section similar to the cross section shown in FIG. 18.

As shown in FIG. 19, in a supporting-terminal-equipped capacitor chip 50m according to the modification of the fifth preferred embodiment of the present invention, rising portions 58aw are provided at both ends of first electrically conductive plate 58a in width direction W. One rising portion 58aw extends along first side surface 113. The other rising portion 58aw extends along second side surface 114.

In supporting-terminal-equipped capacitor chip 50m according to the modification of the fifth preferred embodiment of the present invention, first outer electrode 120 and first electrically conductive plate 58a are connected to each other with first side surface 113 and one rising portion 58aw facing each other and second side surface 114 and other rising portion 58aw facing each other, and thus the mounting stability and connection reliability of supporting-terminal-equipped capacitor chip 50m are able to be significantly improved.

In the description of the preferred embodiments described above, features, components, and elements that are able to be combined may be combined with each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A mounted structure of a supporting-terminal-equipped capacitor chip, the mounted structure comprising:
   a capacitor chip;
   a first supporting terminal and a second supporting terminal that each support the capacitor chip; and
   a circuit board including a main surface on which each of a first land and a second land is provided, the first land being connected to the first supporting terminal, the second land being connected to the second supporting terminal; wherein
   the capacitor chip includes:
      a multilayer body including:
         a plurality of dielectric layers and a plurality of inner electrode layers alternately layered;
         a first main surface and a second main surface facing each other in a height direction;
         a first side surface and a second side surface facing each other in a width direction orthogonal to the height direction; and
         a first end surface and a second end surface facing each other in a length direction orthogonal to both the height direction and the width direction; and
      a first outer electrode and a second outer electrode each provided on a surface of the multilayer body;
   the plurality of inner electrode layers includes a first inner electrode layer connected to the first outer electrode and a second inner electrode layer connected to the second outer electrode;
   the first supporting terminal includes a first helical electrically conductive portion extending in a first axial direction along the main surface of the circuit board;
   the second supporting terminal includes a second helical electrically conductive portion extending in a second axial direction along the main surface of the circuit board;
   the first helical electrically conductive portion is directly connected to the first outer electrode at an outer peripheral side surface of the first helical electrically conductive portion by a first electrically conductive bonding material; and
   the second helical electrically conductive portion is directly connected to the second outer electrode at an outer peripheral side surface of the second helical electrically conductive portion by a second electrically conductive bonding material.

2. The mounted structure of the supporting-terminal-equipped capacitor chip according to claim 1, wherein
the second main surface faces the main surface of the circuit board;
the first outer electrode extends from the first end surface onto the second main surface;
the second outer electrode extends from the second end surface onto the second main surface;
the first supporting terminal is provided between the first land and a portion of the first outer electrode located on the second main surface; and
the second supporting terminal is provided between the second land and a portion of the second outer electrode located on the second main surface.

3. The mounted structure of the supporting-terminal-equipped capacitor chip according to claim 2, wherein
the first supporting terminal is connected to the portion of the first outer electrode located on the second main surface; and
the second supporting terminal is connected to the portion of the second outer electrode located on the second main surface.

4. The mounted structure of the supporting-terminal-equipped capacitor chip according to claim 1, wherein
the first supporting terminal is directly connected to each of the first outer electrode and the first land by the first electrically conductive bonding material; and
the second supporting terminal is directly connected to each of the second outer electrode and the second land by the second electrically conductive bonding material.

5. The mounted structure of the supporting-terminal-equipped capacitor chip according to claim 4, wherein at least one of the first electrically conductive bonding material and the second electrically conductive bonding material includes solder.

6. The mounted structure of the supporting-terminal-equipped capacitor chip according to claim 1, wherein each of the first axial direction and the second axial direction is along the width direction.

7. The mounted structure of the supporting-terminal-equipped capacitor chip according to claim 6, wherein
the first helical electrically conductive portion includes a first electrode connection portion connected to the first outer electrode, a first land connection portion connected to the first land, and a first intermediate portion that links the first electrode connection portion to the first land connection portion;
the first electrode connection portion and the first land connection portion are provided side by side in the first axial direction, the first intermediate portion has a loop shape, and the first intermediate portion is separated from each of the first outer electrode and the first land; and
the second helical electrically conductive portion includes a second electrode connection portion connected to the second outer electrode, a second land connection portion connected to the second land, and a second intermediate portion that links the second electrode connection portion to the second land connection portion;
the second electrode connection portion and the second land connection portion are provided side by side in the second axial direction, the second intermediate portion has a loop shape, and the second intermediate portion is separated from each of the second outer electrode and the second land.

8. The mounted structure of the supporting-terminal-equipped capacitor chip according to claim 1, wherein each of the first axial direction and the second axial direction is along the length direction.

9. The mounted structure of the supporting-terminal-equipped capacitor chip according to claim 1, wherein
the first helical electrically conductive portion includes first facing portions facing each other with a space provided between the first facing portions when viewed in the first axial direction; and
the second helical electrically conductive portion includes second facing portions facing each other with a space provided between the second facing portions when viewed in the second axial direction.

10. The mounted structure of the supporting-terminal-equipped capacitor chip according to claim 1, wherein each of the plurality of dielectric layers includes dielectric particles each having a perovskite structure including at least Ti.

11. The mounted structure of the supporting-terminal-equipped capacitor chip according to claim 1, wherein each of the first outer electrode and the second outer electrode includes an underlying electrode layer and a plating layer provided on the underlying electrode layer.

12. The mounted structure of the supporting-terminal-equipped capacitor chip according to claim 11, wherein
the underlying electrode layer includes at least one of a baked electrode layer, a resin electrode layer, and a thin film electrode layer; and
the plating layer includes at least one metal selected from a group consisting of Ni, Cu, Ag, Pd, and Au.

13. A supporting-terminal-equipped capacitor chip comprising:
a capacitor chip; and
a first supporting terminal and a second supporting terminal that each support the capacitor chip; wherein
the capacitor chip includes:
a multilayer body including:
a plurality of dielectric layers and a plurality of inner electrode layers alternately layered;
a first main surface and a second main surface facing each other in a height direction;
a first side surface and a second side surface facing each other in a width direction orthogonal to the height direction; and
a first end surface and a second end surface facing each other in a length direction orthogonal to both the height direction and the width direction; and
a first outer electrode and a second outer electrode each provided on a surface of the multilayer body;
the plurality of inner electrode layers include a first inner electrode layer connected to the first outer electrode and a second inner electrode layer connected to the second outer electrode;
the first supporting terminal includes a first helical electrically conductive portion extending in a first axial direction along the second main surface;
the second supporting terminal includes a second helical electrically conductive portion extending in a second axial direction along the second main surface;
the first helical electrically conductive portion is directly connected to the first outer electrode at an outer peripheral side surface of the first helical electrically conductive portion by a first electrically conductive bonding material; and
the second helical electrically conductive portion is directly connected to the second outer electrode at an outer peripheral side surface of the second helical electrically conductive portion by a second electrically conductive bonding material.

14. The supporting-terminal-equipped capacitor chip according to claim 13, wherein
the first outer electrode extends from the first end surface onto the second main surface;
the second outer electrode extends from the second end surface onto the second main surface;
the first supporting terminal is connected to a portion of the first outer electrode located on the second main surface; and
the second supporting terminal is connected to a portion of the second outer electrode located on the second main surface.

15. The supporting-terminal-equipped capacitor chip according to claim 13, wherein each of the first axial direction and the second axial direction is along the width direction.

16. The supporting-terminal-equipped capacitor chip according to claim 13, wherein each of the first axial direction and the second axial direction is along the length direction.

17. The supporting-terminal-equipped capacitor chip according to claim 13, wherein
the first helical electrically conductive portion includes first facing portions facing each other with a space between the first facing portions when viewed in the first axial direction; and
the second helical electrically conductive portion includes second facing portions facing each other with a space between the second facing portions when viewed in the second axial direction.

* * * * *